(12) United States Patent
Hosono

(10) Patent No.: US 9,171,962 B2
(45) Date of Patent: Oct. 27, 2015

(54) SEMICONDUCTOR DEVICE AND METHOD OF MANUFACTURING THE SAME

(71) Applicant: ROHM CO., LTD., Kyoto (JP)

(72) Inventor: Tsuyoshi Hosono, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 21 days.

(21) Appl. No.: 13/768,506

(22) Filed: Feb. 15, 2013

(65) Prior Publication Data
US 2013/0214343 A1 Aug. 22, 2013

(30) Foreign Application Priority Data

Feb. 16, 2012 (JP) ................................. 2012-31900

(51) Int. Cl.
H01L 29/788 (2006.01)
H01L 29/66 (2006.01)
H01L 21/28 (2006.01)
H01L 27/115 (2006.01)

(52) U.S. Cl.
CPC ........ *H01L 29/788* (2013.01); *H01L 21/28273* (2013.01); *H01L 27/11524* (2013.01); *H01L 29/66825* (2013.01); *H01L 29/7883* (2013.01)

(58) Field of Classification Search
CPC ..................... H01L 27/11519; H01L 29/7881; H01L 27/11524; H01L 29/66825; H01L 21/0206; H01L 21/28273; H01L 27/115; H01L 27/11521; H01L 29/42324; H01L 29/788; H01L 29/7883; G11C 16/0408; G11C 16/10
USPC ........................................... 257/319, E27.103
See application file for complete search history.

(56) References Cited

U.S. PATENT DOCUMENTS

| 2006/0145237 A1* | 7/2006 | Kim et al. ..................... 257/314 |
| 2007/0257298 A1* | 11/2007 | Lojek ............................. 257/314 |
| 2010/0133603 A1* | 6/2010 | Sekiguchi ..................... 257/319 |
| 2011/0079835 A1* | 4/2011 | Noguchi et al. .............. 257/298 |

FOREIGN PATENT DOCUMENTS

JP 09-283643 A 10/1997

* cited by examiner

Primary Examiner — Kyoung Lee
Assistant Examiner — Ratisha Mehta
(74) Attorney, Agent, or Firm — Rabin & Berdo, P.C.

(57) ABSTRACT

A semiconductor device includes a gate insulating film formed on the semiconductor substrate; a floating gate formed on the gate insulating film; a control gate formed on the floating gate and has a side coplanar with a side of the floating gate; a tunnel diffusion layer facing a portion of the floating gate; and a tunnel window formed in a portion of the gate insulating film between the floating gate and the tunnel diffusion layer, the tunnel window being formed to be thinner than a remaining peripheral portion of the gate insulating film.

7 Claims, 24 Drawing Sheets

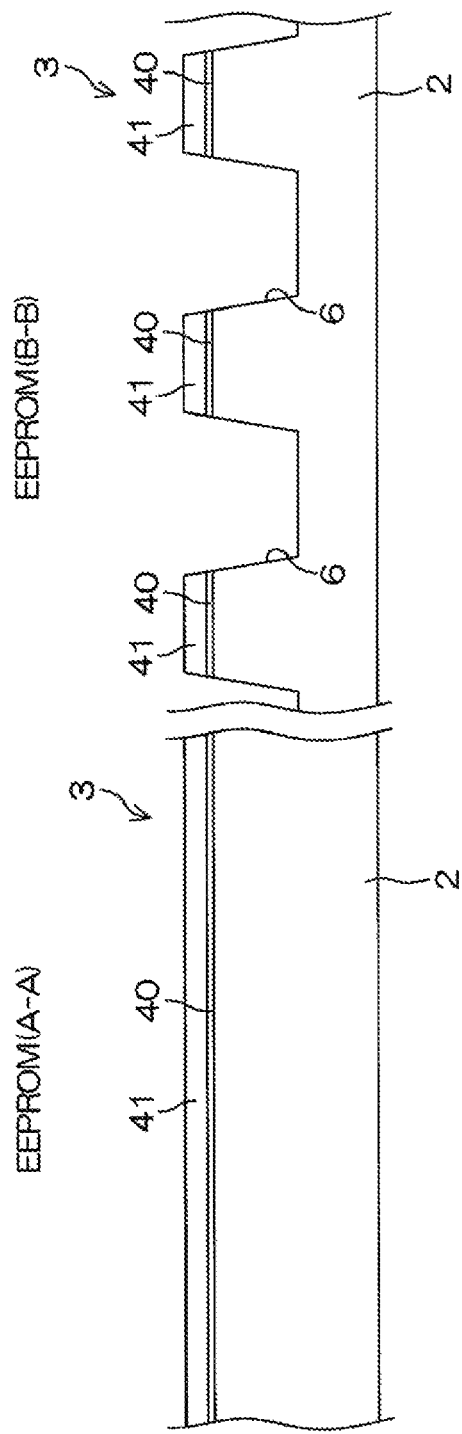

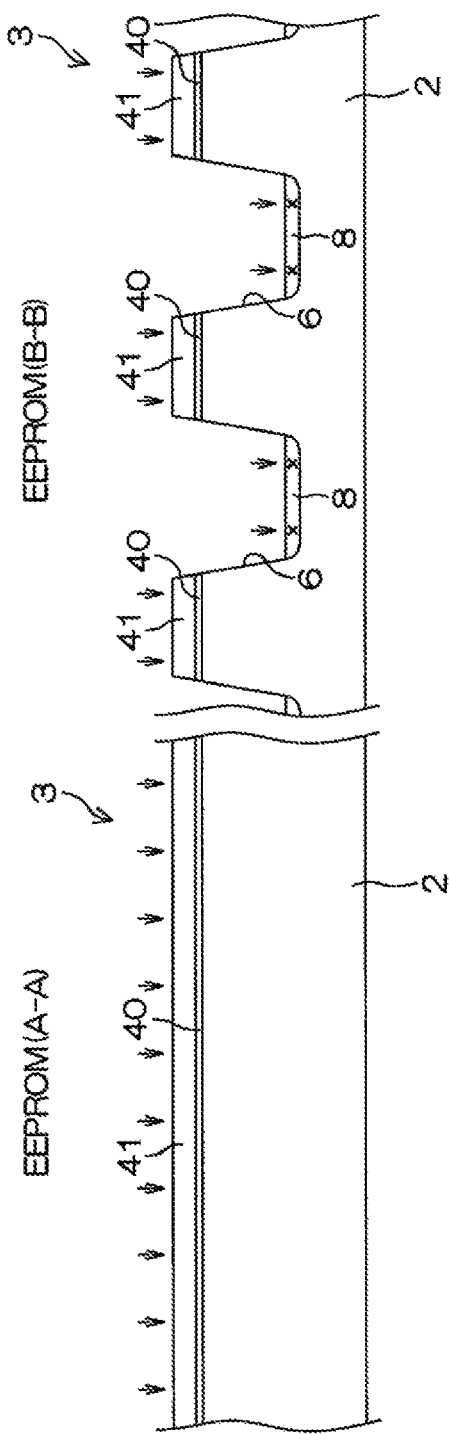

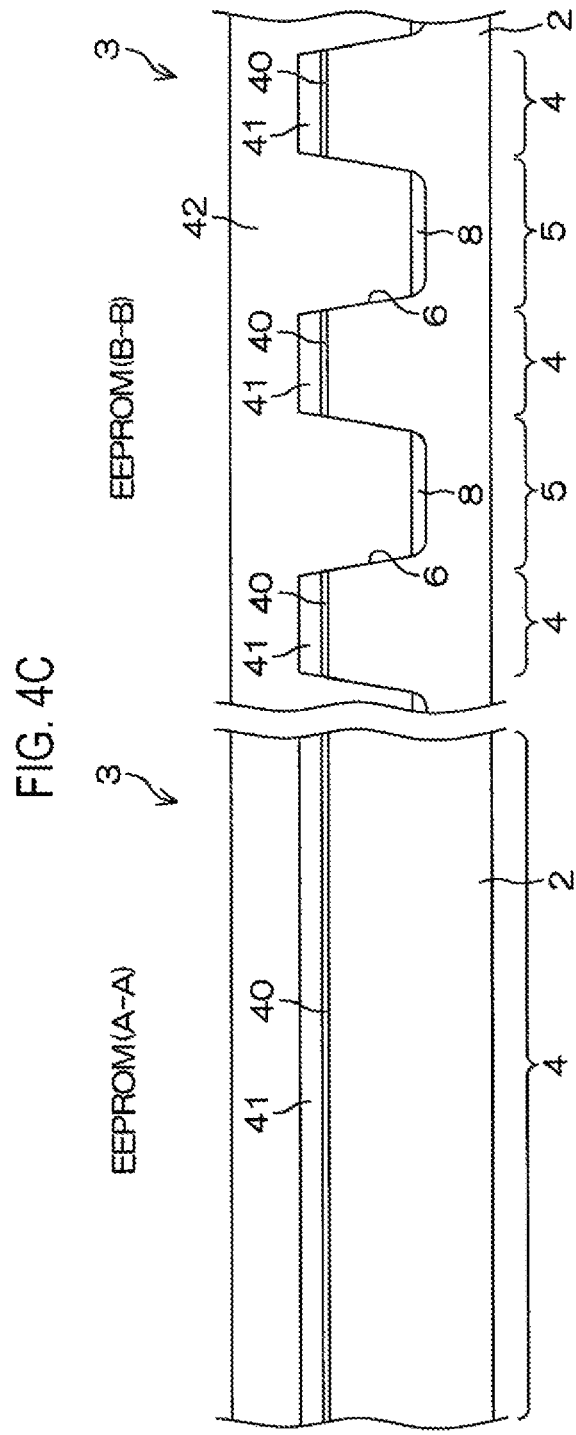

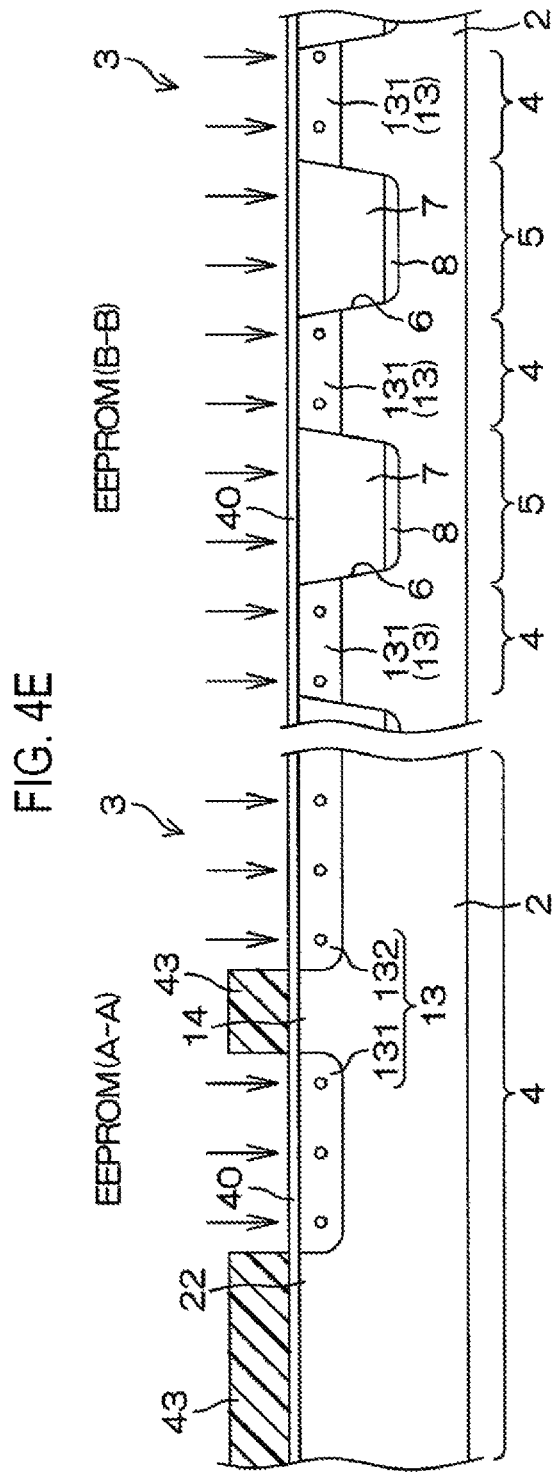

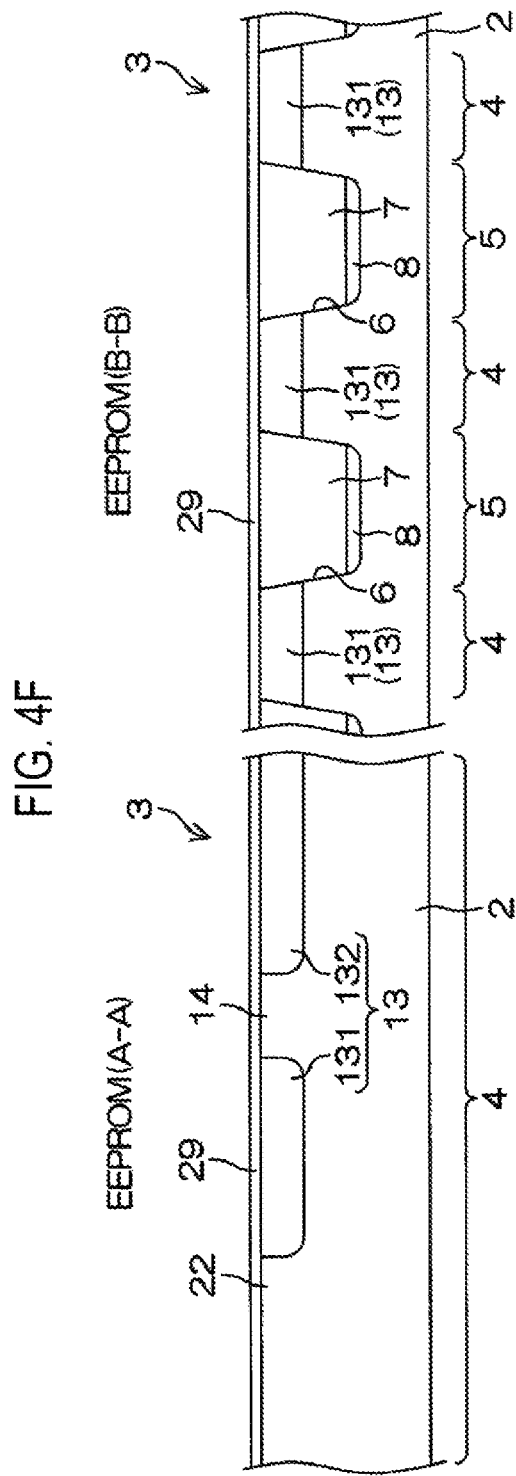

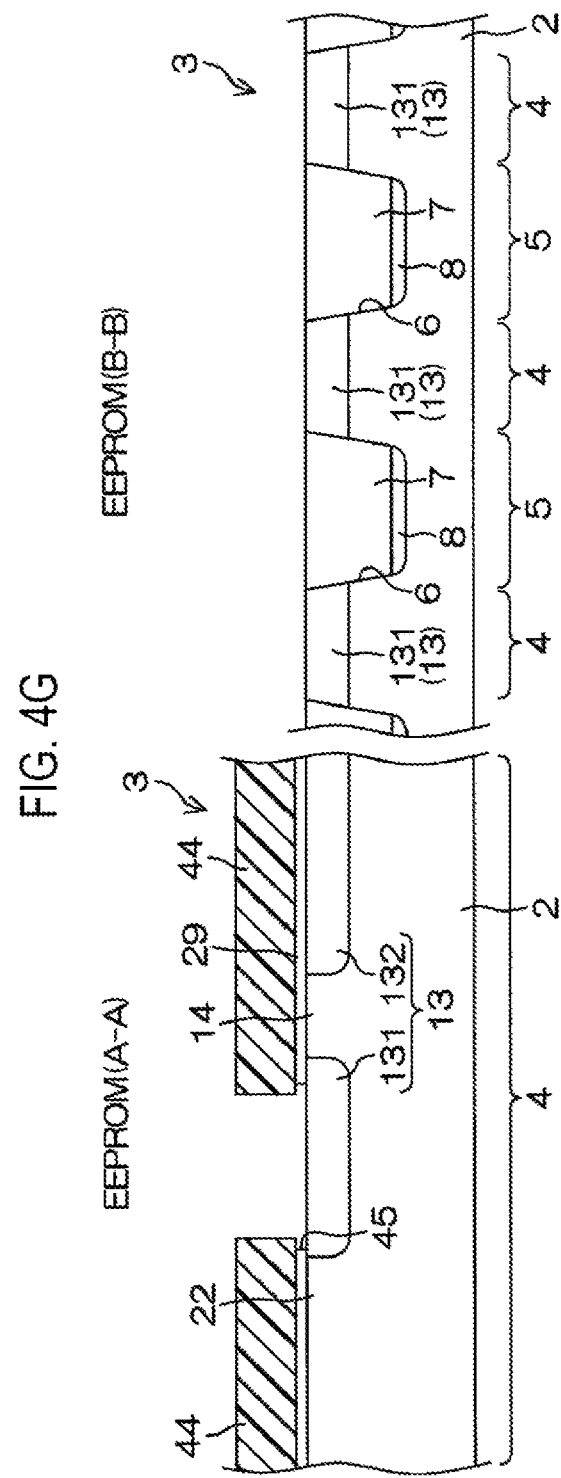

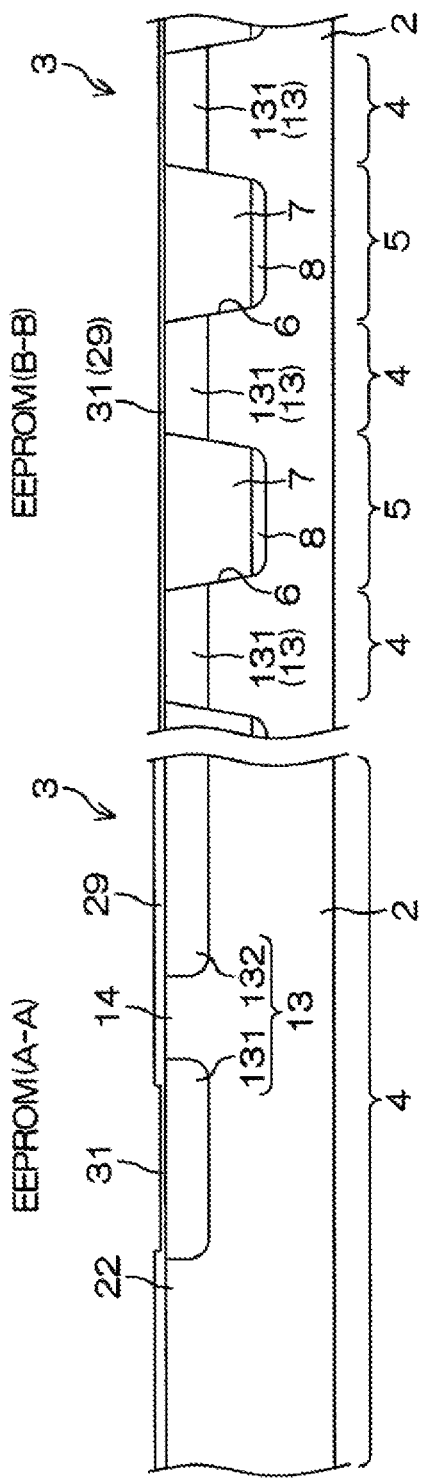

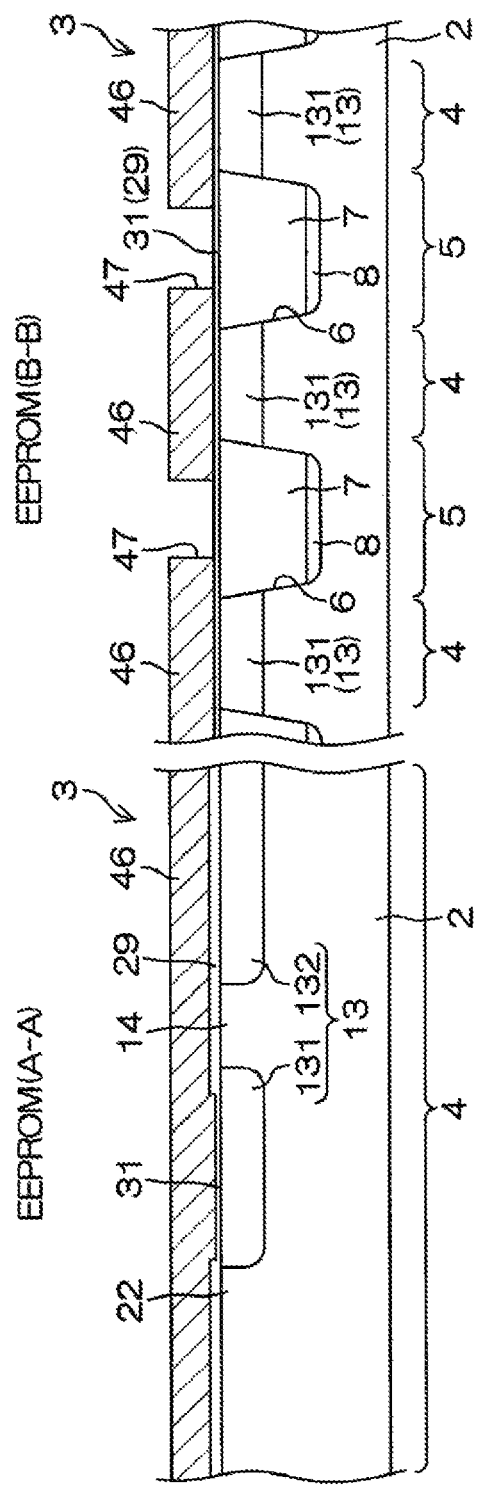

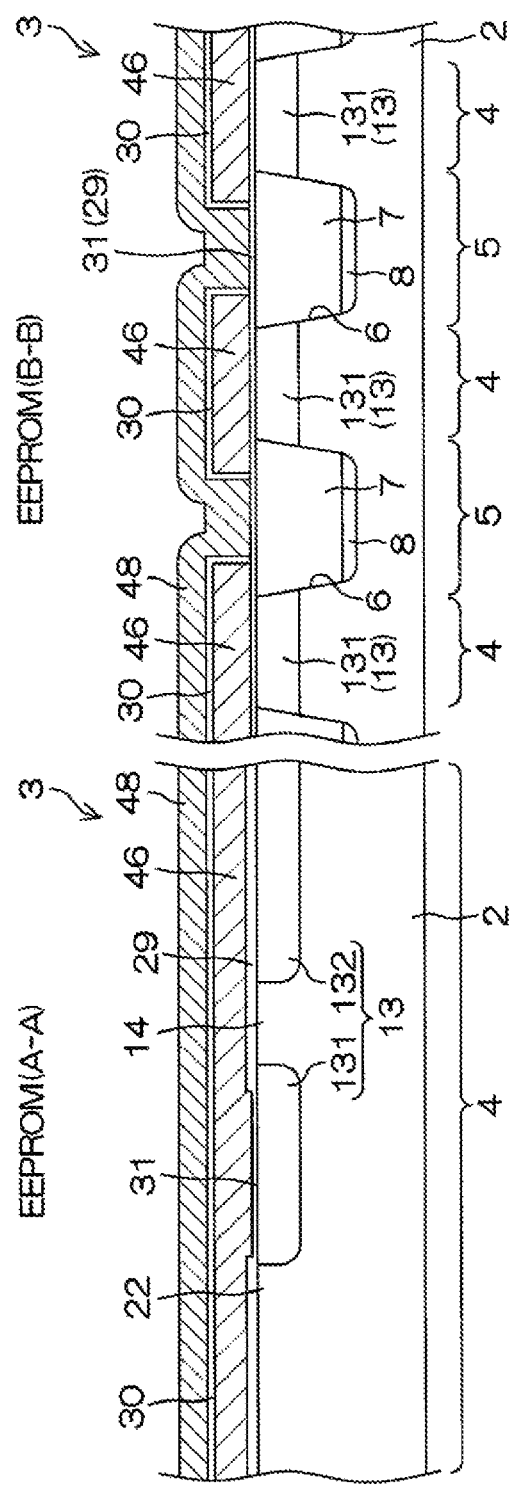

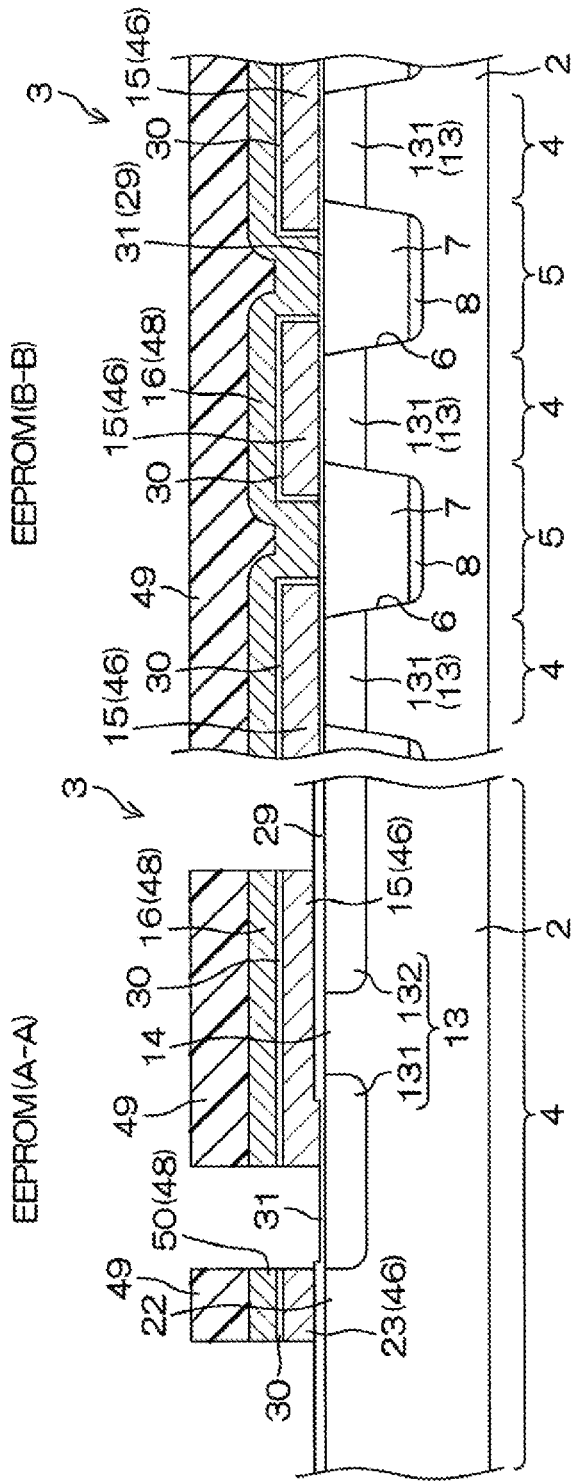

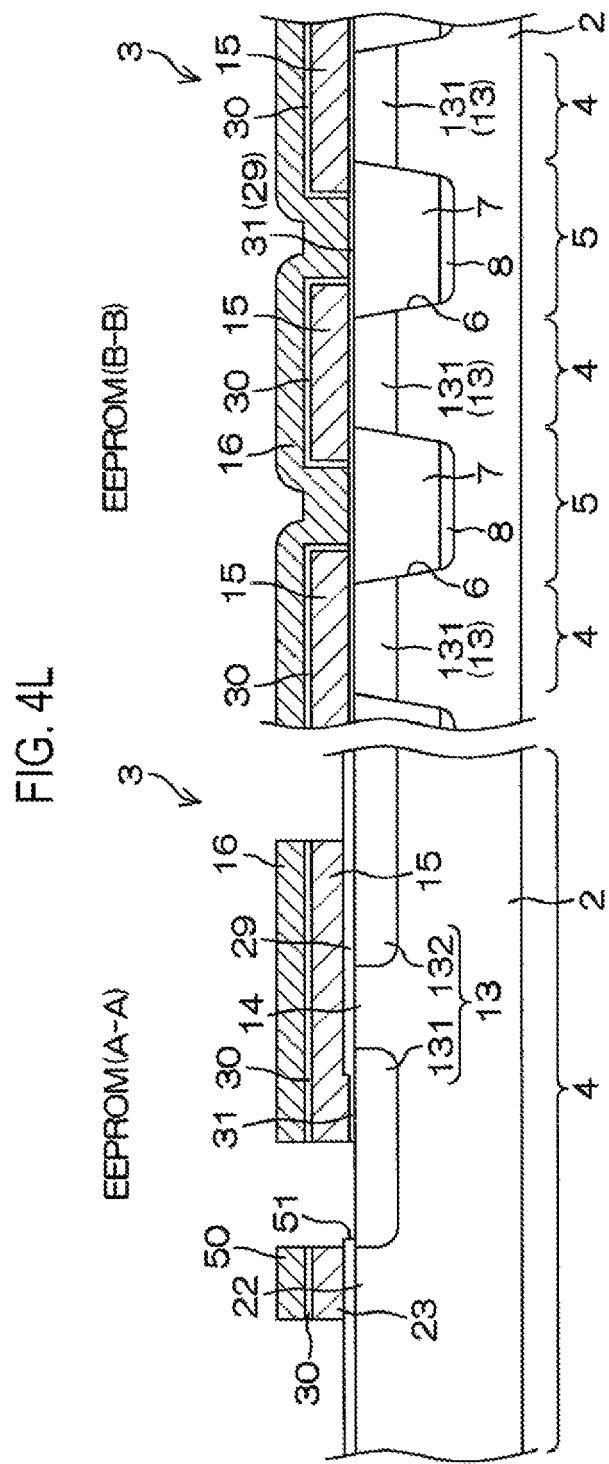

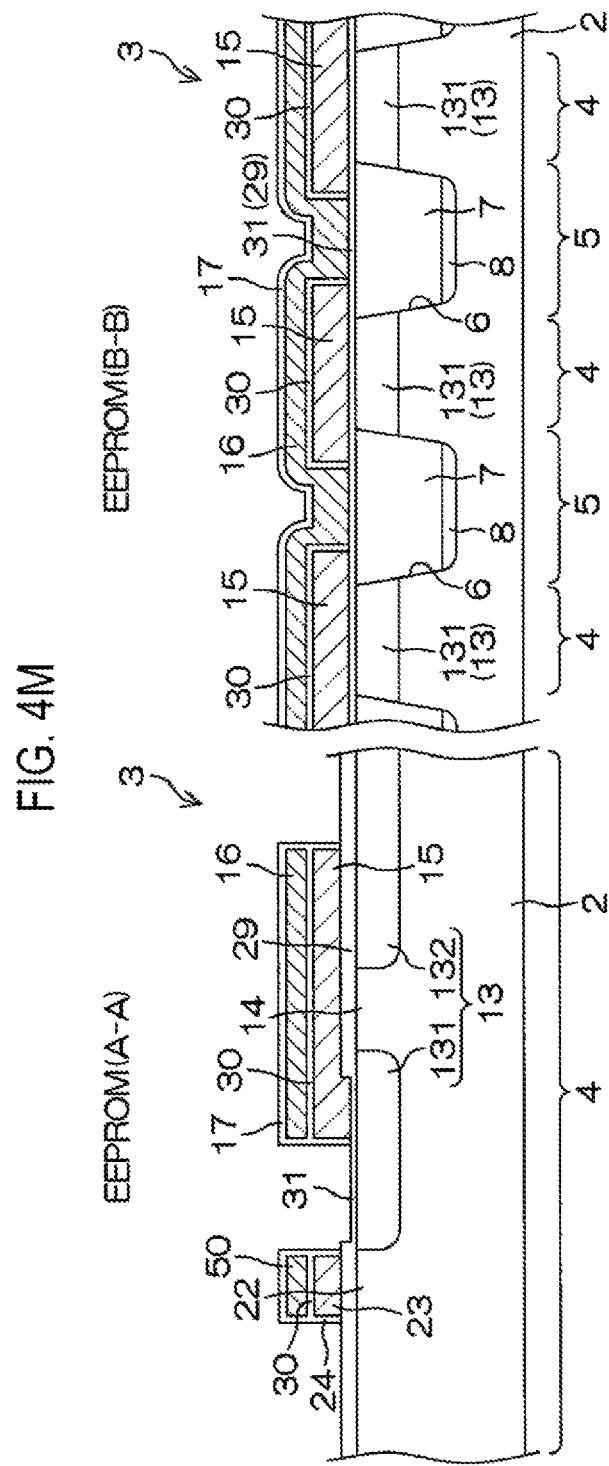

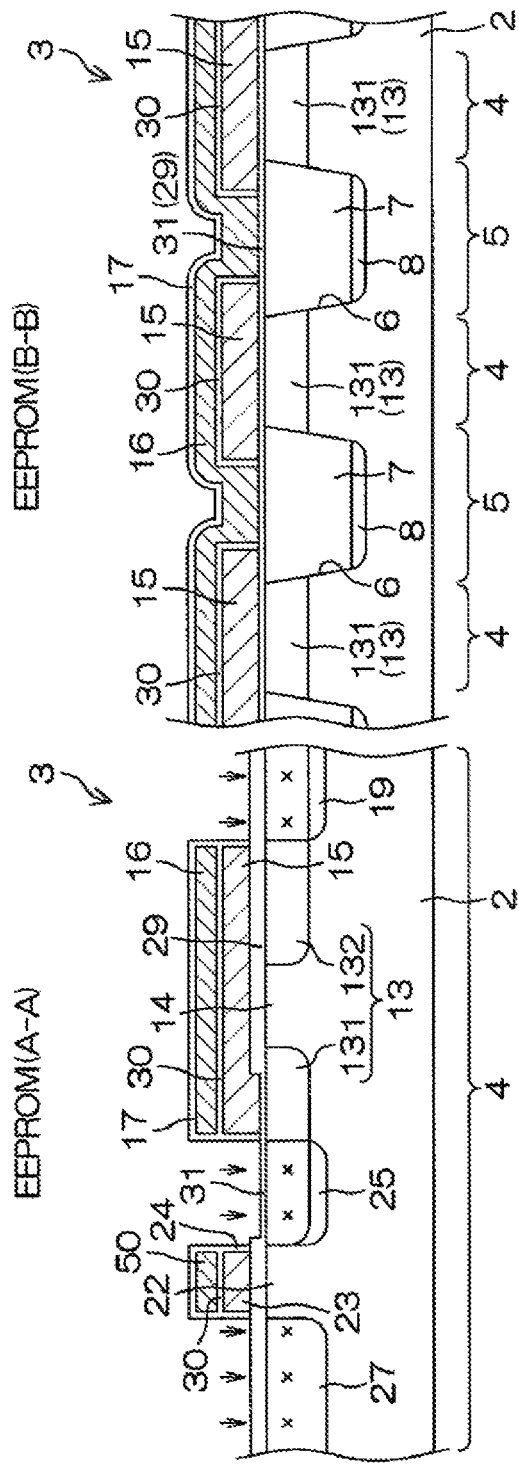

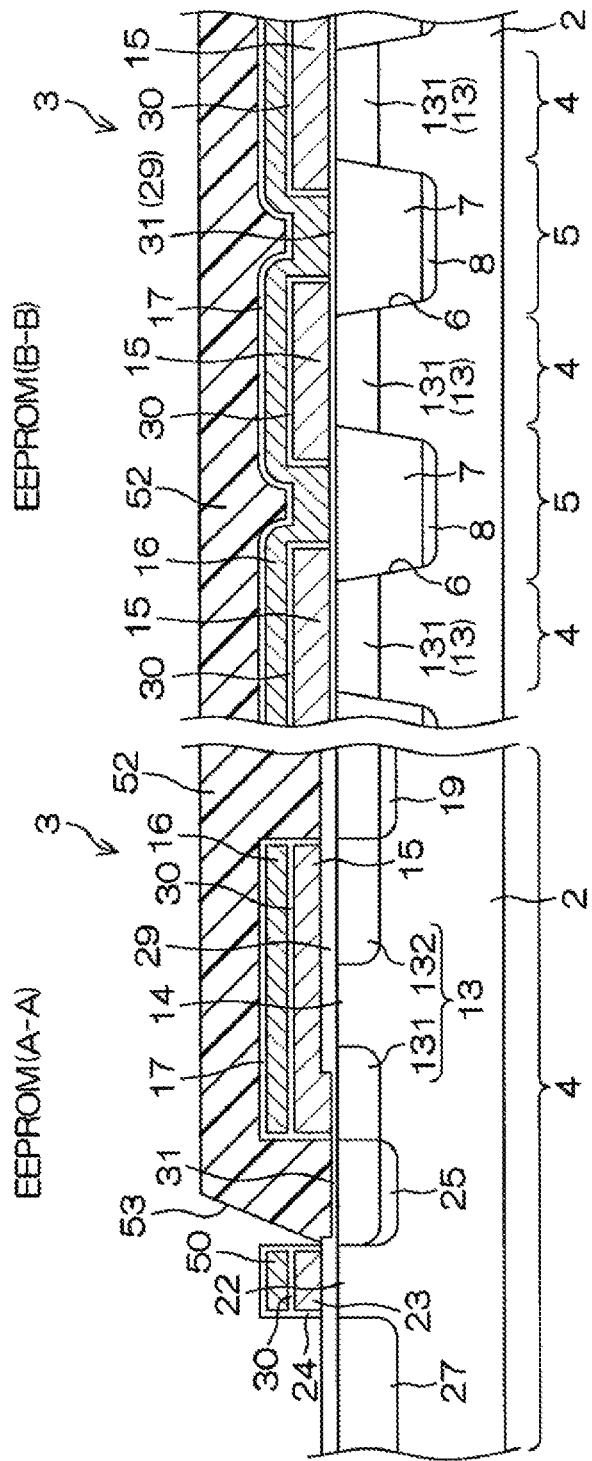

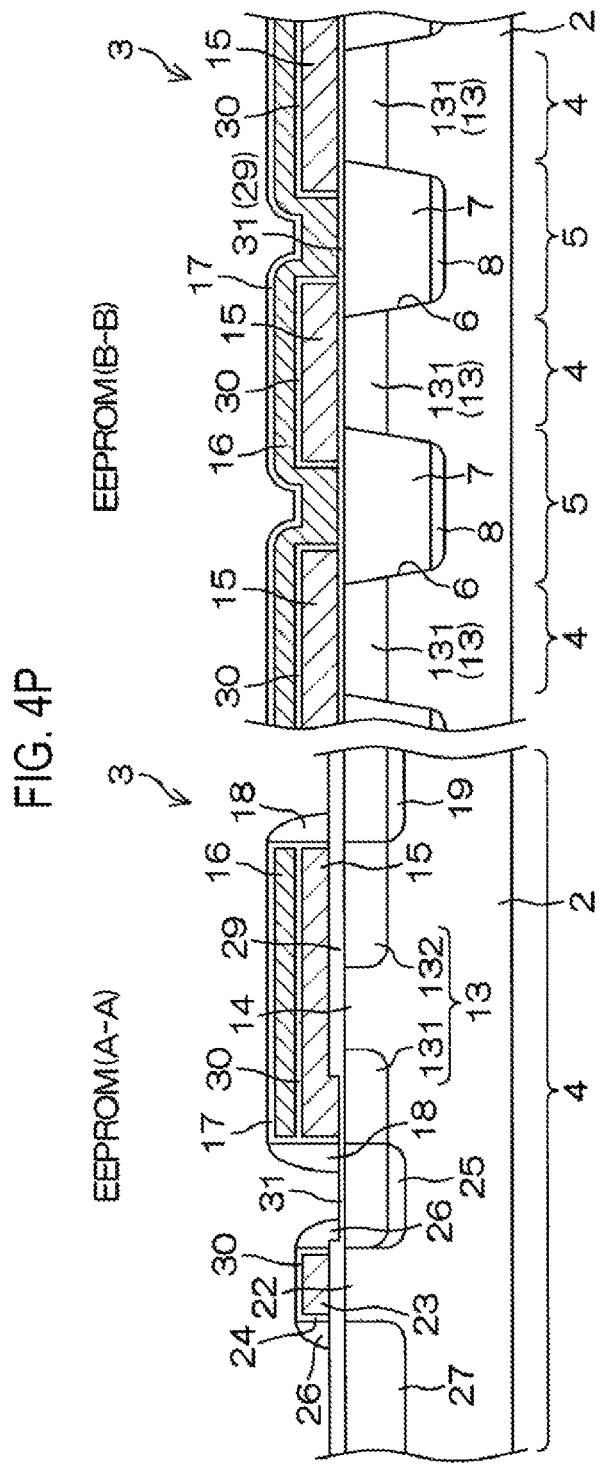

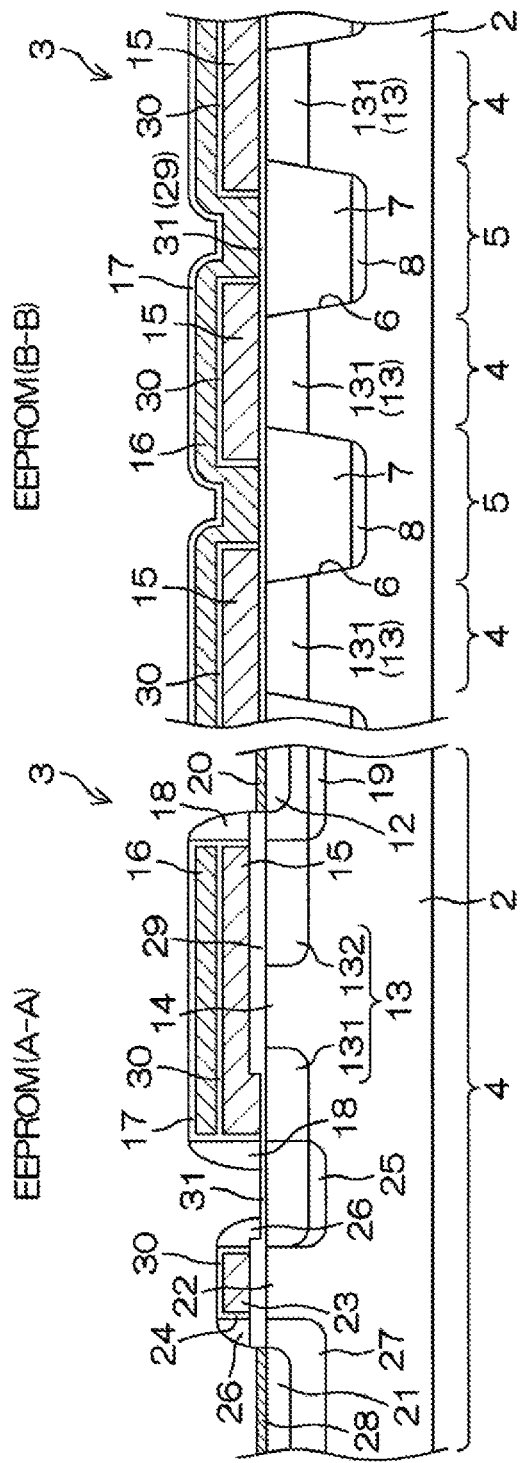

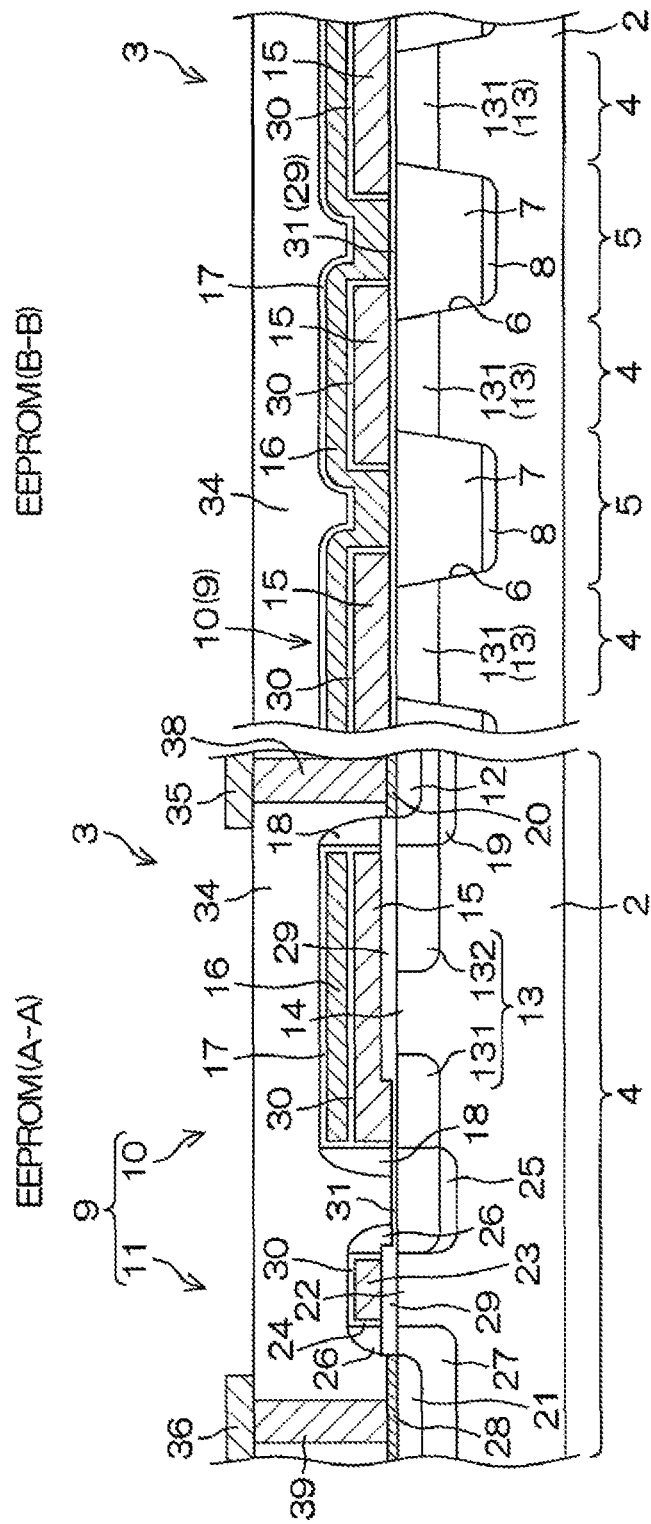

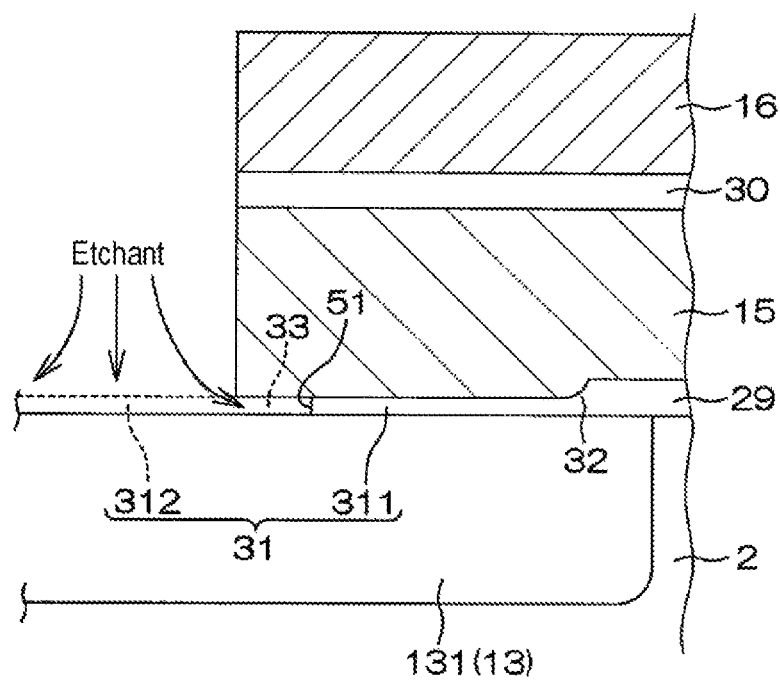

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2012-31900, filed on Feb. 16, 2012, the entire contents of which are incorporated herein by reference.

TECHNICAL FIELD

The present disclosure relates to a semiconductor device including a nonvolatile memory cell having a tunnel diffusion layer, and a method of manufacturing the same.

BACKGROUND

A FLOTOX (Floating Gate Tunnel Oxide) type EEPROM (Electrically Erasable and Programmable ROM) is a semiconductor memory including a nonvolatile memory cell constituted by a stacked-gate type memory cell transistor and a select transistor connected in series to the cell transistor. Such type of EEPROM has a tunnel window which is formed in a portion serving as an electron passage during write/erase operation of data in a gate insulating film formed on a semiconductor substrate, and is thinner than a peripheral gate insulating film. A floating gate is formed on the tunnel window and a select gate is formed at a portion spaced from the tunnel window in the gate insulating film.

In the semiconductor device of related art, a plurality of element forming regions is formed on a front surface of a base substrate (wafer) made of silicon and a gate oxide film is formed by oxidizing each of the element forming regions. Subsequently, a tunnel oxide film having a reduced thickness is formed by partially etching the gate oxide film in a predetermined element forming region. In addition, a channel is formed by injecting ions into the base substrate and first and second memory cell diffusion layers of n⁻ type are formed. Subsequently, a polysilicon layer is formed on the gate oxide film. Then, the polysilicon layer is masked by a resist pattern and is etched into a predetermined pattern of polysilicon layer. Thus, a floating gate and a select gate constituted by the remaining polysilicon layer are simultaneously formed on the gate oxide film. Thereafter, an insulating ONO (Oxide-Nitride-Oxide) film is formed on front and side surfaces of the floating gate and a control gate is further formed on the ONO film to cover the front and side surfaces of the floating gate.

However, in the semiconductor device of the related art, since the control gate covers both of the front and side surfaces of the floating gate, there is a need of an extra space on the semiconductor substrate by a thickness of the control gate covering the side surfaces, which has a limit on cell miniaturization. If the side surfaces of the control gate are coplanar with the side surfaces of the floating gate, the miniaturization problem may be overcome. However, no matter how high the alignment accuracy, it is very difficult to form the control gate having the same shape as the patterned floating gate. Therefore, there is a problem of a positional deviation between the floating gate and the control gate which causes a variation in a threshold voltage.

SUMMARY

The present disclosure provides some embodiments of a semiconductor device and a method of manufacturing the same, which are capable of limiting a variation in a threshold voltage of a floating gate and miniaturizing a cell.

According to one embodiment of the present disclosure, there is provided a semiconductor device including a nonvolatile memory cell selectively formed on a semiconductor substrate, including: a gate insulating film formed on the semiconductor substrate; a floating gate selectively formed on the gate insulating film in a region for the nonvolatile memory cell; a control gate which is formed on the floating gate and has a side coplanar with a side of the floating gate; a select gate which is selectively formed on the gate insulating film in the region for the nonvolatile memory cell and has a mono-layered structure of a conductive film flush with the floating gate; a tunnel diffusion layer facing a portion of the floating gate in the semiconductor substrate; and a tunnel window formed in a portion of the gate insulating film between the floating gate and the tunnel diffusion layer, the tunnel window being formed to be thinner than a remaining peripheral portion of the gate insulating film.

With this configuration, the sides of the control gate and the floating gate are coplanar and the control gate does not project from the floating gate. That is, these two gates are accommodated in a region on the same space of the semiconductor substrate, thereby achieving a space-saving and hence cell miniaturization. In addition, since the side surfaces of these gates are coplanar and there is no positional deviation therebetween, it is possible to limit a variation in a threshold voltage of the floating gate. The semiconductor device of the present disclosure can be manufactured by the semiconductor device manufacturing method of the present disclosure.

According to another embodiment of the present disclosure, there is provided a method of manufacturing a semiconductor device including a nonvolatile memory cell selectively formed on a semiconductor substrate, the method including: forming a gate insulating film on the semiconductor substrate; forming a tunnel diffusion layer by selectively introducing impurities into a region for the nonvolatile memory cell in the semiconductor substrate; forming a tunnel window by selectively removing a portion of the gate insulating of the tunnel diffusion layer and then thermally oxidizing the exposed semiconductor substrate to make the tunnel window thinner than a remaining peripheral gate insulating film; stacking a first conductive film and a second conductive film in this order on the gate insulating film to cover the tunnel window; forming a floating gate constituted by the first conductive film and a control gate constituted by the second conductive film at a position facing the tunnel diffusion layer in which the tunnel window is formed and, at the same time, forming a select gate constituted by the first conductive film and a sacrificial gate constituted by the second conductive film at a position apart from the tunnel window by selectively etching the first conductive film and the second conductive film in this order using the same mask pattern; and removing the sacrificial gate by etching the sacrificial gate using a mask pattern to cover the floating gate, the control gate and the tunnel window.

With this method, since the floating gate and the control gate are simultaneously formed by an etching operation using the same mask pattern, the side surfaces of these two gates can have the same plane irrespective of alignment accuracy of the control gate with respect to the floating gate.

On the other hand, if the second conductive film is formed in portions other than the portion where the floating gate is formed in the nonvolatile memory cell region, the second conductive film may be left on the select gate formed of the first conductive film. With this second conductive film being electrically floated, a threshold voltage of the select gate is likely to be unstable in an operation of the memory cell (write, erase and read). The residual second conductive film has to be fixed at a ground potential in order to avoid this problem. However, this requires a wasteful wiring space, which may be an obstacle to improvement of miniaturization of the nonvolatile memory cell.

However, some embodiments of the present disclosure, the sacrificial gate (the second conductive film) left on the select gate is removed by an etching operation after forming the floating gate and the control gate. This eliminates a need of the wasteful wiring space. In some embodiments, the method further includes: forming the mask pattern to remove the sacrificial gate by forming a resist film on the gate insulating film and then forming an opening having a tapered shape increasing in diameter from a bottom toward a top of the opening so that the sacrificial gate is exposed.

With this method, it is possible to simply expose the sacrificial gate to be removed while covering the tunnel window. In some embodiments, the semiconductor device further include: a drain region formed in the opposite side of the tunnel diffusion layer to the select gate in the semiconductor substrate; and a drain low concentration layer which is formed to be self-aligned with the select gate to correspond to the drain region in the semiconductor substrate and widened to a region deeper than the drain region, and has an impurity concentration lower than that of the drain region.

Since a high voltage (for example, about 15V) may need to be applied to the select gate for an operation of the memory cell, there is a need to secure a high withstanding voltage in the drain region. As one measure, a so-called drain offset which keeps the drain region apart from the select gate may be employed. However, the drain offset is incompatible to miniaturization due to increased size of the memory cell although it may improve a withstanding voltage simply.

With this configuration, since the drain low concentration layer widened to the region deeper than the drain region is formed, a withstanding voltage of the drain region can be improved and the drain low concentration layer is formed to be self-aligned with the select gate. This can prevent a size of the memory cell from being increased. The semiconductor device having the above configuration can be manufactured, in some embodiments, according to the method further including: forming a drain region in an opposite side of the tunnel diffusion layer to the select gate in the semiconductor substrate; and forming a drain low concentration layer which is widened to a region deeper than the drain region by introducing impurities in a manner to be self-aligned with a stacked structure of the select gate and the sacrificial gate to correspond to the drain region, the drain low concentration layer having an impurity concentration lower than that of the drain region.

With this method, since the drain low concentration layer is formed before removing the sacrificial gate, the sacrificial gate is left on the select gate when impurities for the drain low concentration layer are introduced into the semiconductor substrate. Accordingly, it is possible to prevent the impurities from being escaped from the select gate and being introduced into a portion right below the select gate even if an acceleration voltage applied to the impurities is increased to expand the drain low concentration layer to a region deeper than the drain region. This allows a withstanding voltage of the drain region to be improved simply without changing a surface concentration of the portion right below the select gate. In this case, preferably, the forming a drain low concentration layer includes introducing the impurities at an acceleration voltage of 50 keV to 100 keV.

In some embodiments, the depth of the drain low concentration layer formed as above is 0.2 μm 0.3 μm. This range of depth of the drain low concentration layer can achieve a sufficient withstanding voltage. In some embodiments, the forming a floating gate and a control gate includes forming the floating gate and the control gate to cover a first portion having a predetermined width in the tunnel window along a front surface of the semiconductor substrate from a first boundary edge neighboring the peripheral gate insulating film and, at the same time, selectively exposing a second portion of the tunnel window.

With this method, the floating gate and the control gate are formed to cover one portion (the first portion) of the tunnel window having the preset size, the one portion having a predetermined width from the first boundary edge of the tunnel window. By covering the tunnel window by a required predetermined width with respect to the first boundary edge, the width of the first portion can be freely adjusted. Accordingly, it is possible to miniaturize the first portion (a portion between the floating gate and the tunnel diffusion layer) responsible for substantial function of the tunnel window irrespective of size of the pre-formed tunnel window. This method can provide a semiconductor device wherein the tunnel window includes the first portion covered by the floating gate and the second portion not covered by the floating gate.

In this case, the method may further include: removing the mask pattern used to form the floating gate under a state where the second portion of the tunnel window is exposed; and selectively removing the second portion of the tunnel window and a second boundary edge of the first portion neighboring the second portion by etching the second portion and the second boundary edge of the first portion after removing the mask pattern, and then, thermally oxidizing the semiconductor substrate to form a film thicker than a remainder of the first portion than the second boundary edge on the front surface of the semiconductor substrate exposed by the selective removing.

With this method, the surface of the tunnel window damaged when removing the mask pattern can be reproduced with good conditions. Accordingly, it is possible to obtain a semiconductor device wherein, in the tunnel window, the second portion and the second boundary edge neighboring the second portion are selectively thickened. In this case, a film thickness difference selectively produced in the tunnel window is provided by a step is formed in a bottom side of the second boundary edge with the top of the second portion flush with the top of the first portion.

Preferably, the forming a floating gate and a control gate includes covering the first portion with the floating gate and the control gate in such a manner that the predetermined width is 0.2 μm to 0.3 μm. In some embodiments, the dimension of the first portion of the tunnel window along a front surface of the semiconductor substrate is 0.2 μm to 0.3 μm.

In some embodiments, the region for the nonvolatile memory cell includes a plurality of active areas arranged at intervals, and an isolation portion which is provided in a portion other than the active areas and has a STI (Shallow Trench Isolation) structure where an insulator is buried in a groove dug from the front surface of the semiconductor substrate, and the depth of the groove of the STI structure is 0.5 μm or more.

With this configuration, the peripheral length (sum of side length and bottom length) of the groove of the STI structure can be made larger than conventional, which can prevent leak current from flowing between adjacent active areas. In some embodiments, the semiconductor device having the above configuration can be manufactured according to the method further including: forming a groove having a depth of 0.5 μm or more by selectively digging the semiconductor substrate from the front surface of the semiconductor substrate in the region for the nonvolatile memory cell, forming an isolation portion having a STI (Shallow Trench Isolation) structure by filling the groove with an insulator, and forming a plurality of active areas arranged at intervals in the region for the nonvolatile memory cell.

In this case, the forming a gate insulating film may include forming the gate insulating film by thermal oxidation of 950 degrees C. or higher. With this method, even if the insulator having a STI structure is expanded when the gate insulating film is formed, the degree of expansion can be restricted to alleviate a stress exerted on the peripheral semiconductor substrate having the STI structure. This configuration is particularly effective when a groove having a depth of 0.5 μm or more is formed since crystal defects resulting in leak current are likely to be introduced into the semiconductor substrate when the groove is formed.

In some embodiments, the method further includes: prior to the forming a tunnel window, SPM (Sulfuric acid-hydrogen Peroxide Mixture)-cleaning a surface of the gate insulating film. With this method, the surface of the gate insulating film 29 can be made hydrophilic. This can improve adhesion between the gate insulating film and the mask pattern used when the tunnel window is formed, thereby limiting a positional deviation of the dimension of the tunnel window.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4A is a sectional view for illustrating an example process of manufacturing the semiconductor device, according to some embodiments.

FIG. 4B is a view showing a process following the process of FIG. 4A.

FIG. 4C is a view showing a process following the process of FIG. 4B.

FIG. 4E is a view showing a process following the process of FIG. 4D.

FIG. 4F is a view showing a process following the process of FIG. 4E.

FIG. 4G is a view showing a process following the process of FIG. 4F.

FIG. 4H is a view showing a process following the process of FIG. 4G.

FIG. 4I is a view showing a process following the process of FIG. 4H.

FIG. 4J is a view showing a process following the process of FIG. 4I.

FIG. 4K is a view showing a process following the process of FIG. 4J.

FIG. 4L is a view showing a process following the process of FIG. 4K.

FIG. 4M is a view showing a process following the process of FIG. 4L.

FIG. 4N is a view showing a process following the process of FIG. 4M.

FIG. 4O is a view showing a process following the process of FIG. 4N.

FIG. 4P is a view showing a process following the process of FIG. 4O.

FIG. 4R is a view showing a process following the process of FIG. 4Q.

FIG. 4S is a view showing a process following the process of FIG. 4R.

FIGS. 5A and 5B are sectional views for illustrating a process of forming a tunnel window, according to some embodiments.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
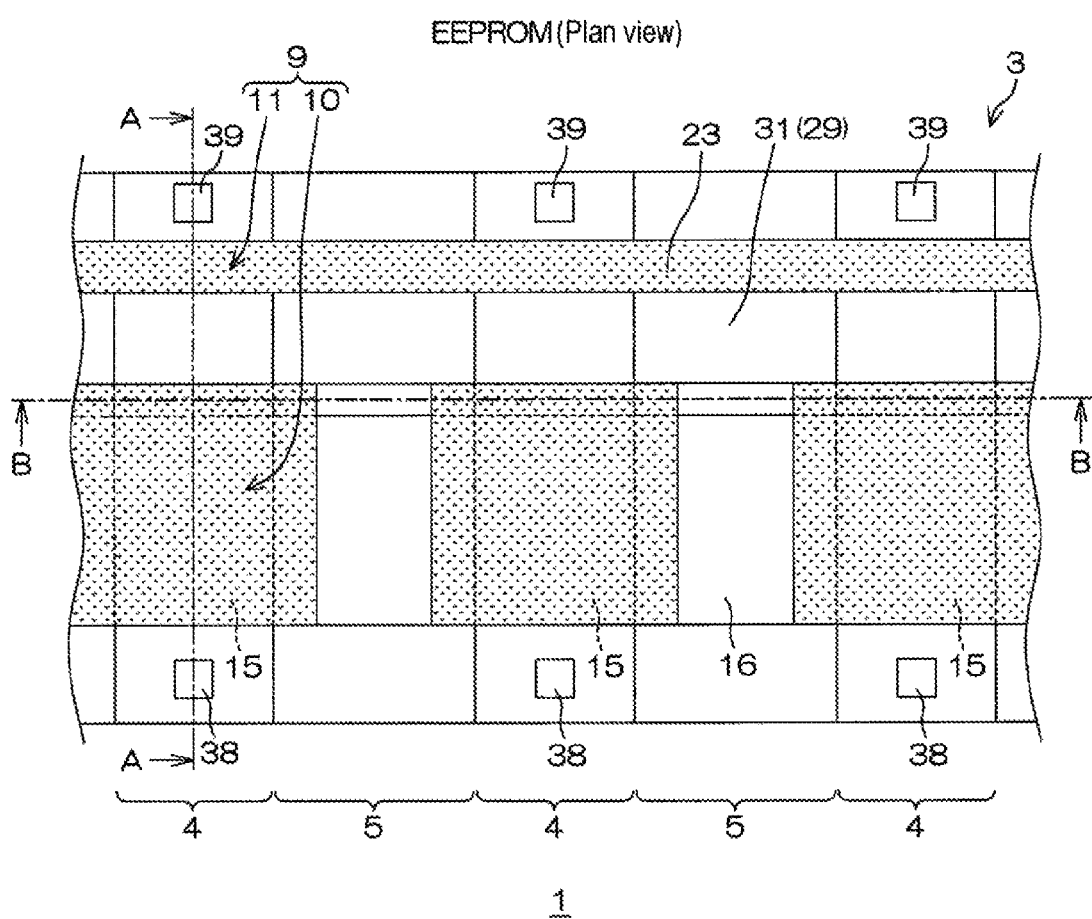
FIG. 1 is a plan view of a semiconductor device, according to some embodiments.
Figure 2:
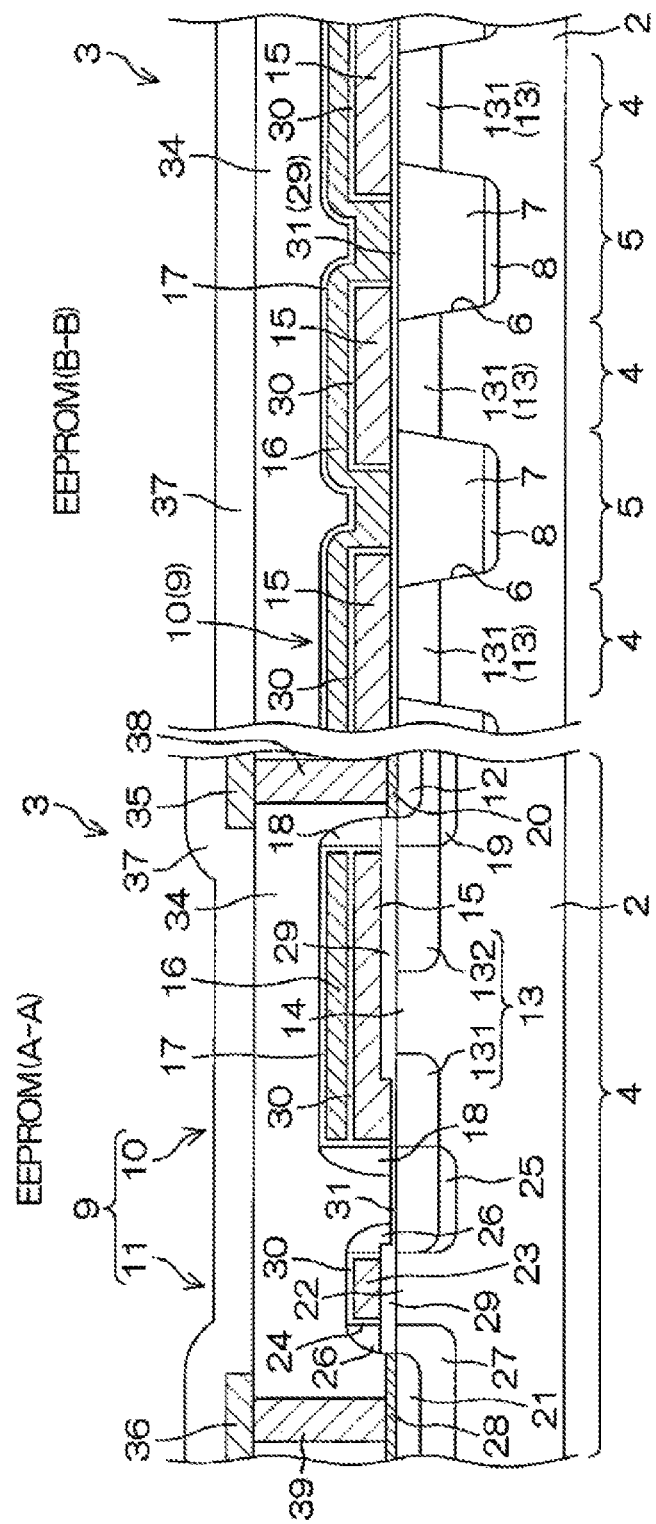
FIG. 2 shows sectional views taken along line A-A and line B-B in FIG. 1.
Figure 3:
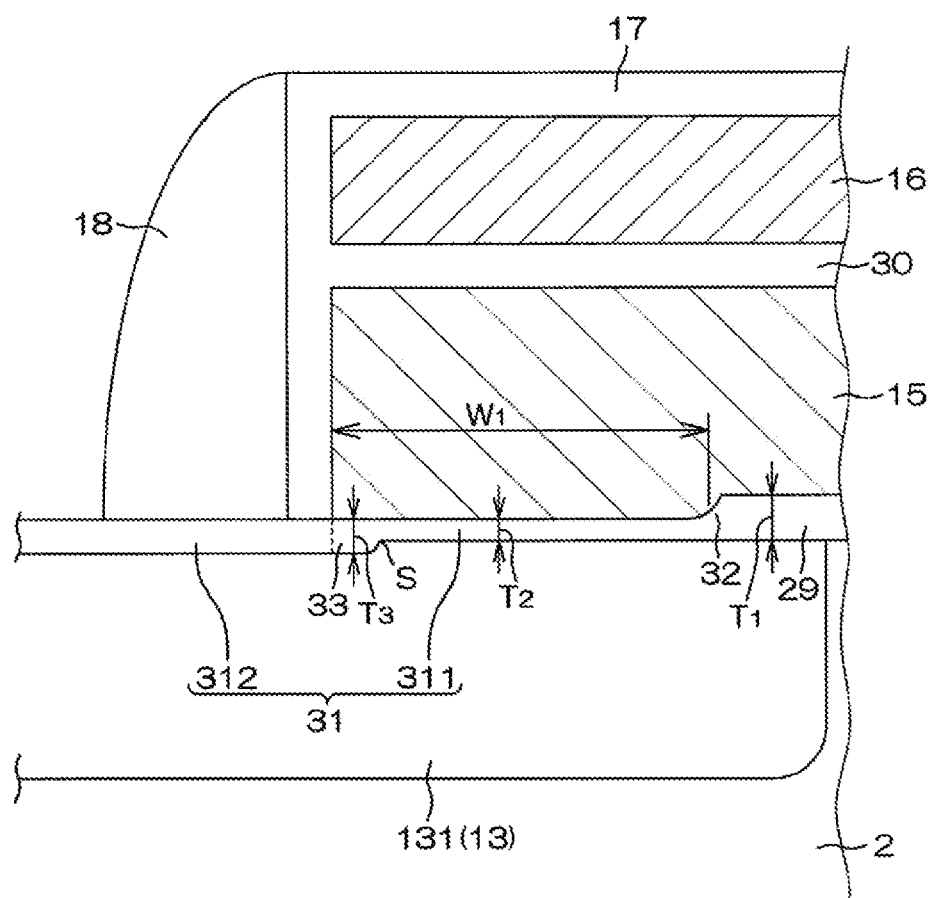
FIG. 3 is an enlarged view of a portion of the semiconductor device shown in FIG. 2.

FIG. 1 is a plan view of a semiconductor device according to an embodiment of the present disclosure. FIG. 2 shows sectional views taken along line A-A and line B-B in FIG. 1. FIG. 3 is an enlarged view of a portion of the semiconductor device shown in FIG. 2. A semiconductor device 1 includes a p-type semiconductor substrate 2 made of, for example, silicon and a memory cell region 3 arranged in the semiconductor substrate 2. Although not shown, a peripheral circuit region in which various devices may be formed, such as a charge pump, a zener diode, a MIS transistor and so on, and may be arranged around the memory cell region 3.

The memory cell region 3 includes a plurality of active areas 4 arranged at intervals (for example, in the form of a matrix) and isolation portions 5 formed in areas other than the active areas 4. As shown in FIG. 2, each of the isolation portions 5 has a STI (Shallow Trench Isolation) structure with an insulator 7 buried in a groove 6 dug relatively thinly from a front surface of the semiconductor substrate 2. The isolation portion 5 may include a silicon oxide film selectively formed on the front surface of the semiconductor substrate 2 by means of, for example, a LOCOS (Local Oxidation of Silicon) method. The groove 6 has a shape of taper being narrowed from an opened end toward a bottom. Depth of the groove 6 is 0.50 μm or more (preferably, 0.50 μm or more and 0.60 μm or less). Regarding the STI structure, the peripheral length (sum of side length and bottom length) of the groove 6 of the STI structure can be made larger than a conventional groove by making the groove 6 deeper than the conventional groove (about 0.4 μm in depth). This can make it difficult for leak current to flow between adjacent active areas 4. In addition, a p type field stop region 8 having concentration higher than that of the semiconductor substrate 2 is formed in a lower portion of the groove 6.

One nonvolatile memory cell 9 (EEPROM) is provided in each of the plurality of active areas 4 partitioned by the isolation portions 5. Thus, a plurality of nonvolatile memory cells 9 are arranged in the form of a matrix in the memory cell region 3. Each nonvolatile memory cell 9 has a structure including a stacked-gate type memory cell transistor 10 and a select transistor 11 connected in series to the memory cell transistor 10.

More specifically, the memory cell transistor 10 includes an n type source region 12 and an n type tunnel diffusion layer 13 which are formed at an interval on the front surface of the semiconductor substrate 2, a channel region 14 formed therebetween, a floating gate 15 disposed to face the channel region 14, and a control gate 16 stacked on the floating gate 15. A thickness of the floating gate 15 is about 1500 Å and a thickness of the control gate 16 is about 1000 Å. For the purpose of clarity, the floating gate 15 is indicated as the shaded region labeled with reference numeral 15, as shown in FIG. 1.

The floating gate 15 is provided in each active area 4. Each floating gate 15 is formed to cover an edge of the insulator 7 of the isolation portion 5 in a direction intersecting (for example, a direction perpendicular to) a longitudinal direction of the active areas 4. On the other hand, the control gate 16 is formed in the form of a line extending in the direction intersecting the longitudinal direction of the active areas 4 and covers all floating gates 15 collectively across the plurality of active areas 4. That is, the control gate 16 serves as a common electrode of the plurality of nonvolatile memory cells 9. Both sides of the floating gate 15 and the control gate 16 in the longitudinal direction of the active areas 4 are made coplanar. This allows a stacked structure of the floating gate 15 and the control gate 16 to have planar sides having no step such that the control gate 16 does not project from the floating gate 15. That is, these two gates 15 and 16 are accommodated in a region on the same space of the semiconductor substrate 2, thereby achieving space-saving, which can result in miniaturization of the memory cell transistor 10. In addition, since both sides of these gates 15 and 16 are formed coplanar and there is no positional deviation between the floating gate 15 and the control gate 16, it is possible to limit a variation of a threshold voltage of the floating gate 15.

An insulating film 17 made of an insulating material such as silicon oxide or the like is formed on the side and top (top of the control gate 16) of this stacked structure. The insulating film 17 has the same thickness as a thinned portion of a gate insulating film 29 in a tunnel window 31 which will be described later. In addition, both sides of the floating gate 15 and the control gate 16 are collectively covered by side walls 18 made of an insulating material such as silicon oxide or the like.

The n type source region 12 is formed in an n type source low concentration layer 19 widened from just below the side wall 18, thus forming an LDD (Lightly Doped Drain) structure. The n type source low concentration layer 19 is formed at a concentration lower than that of the n type source region 12 and doped with impurity ions more deeply than the n type source region 12. For example, the doping depth may be 0.2 μm to 0.3 μm. In addition, the n type source low concentration layer 19 is formed to be self-aligned with the floating gate 15 and the control gate 16. On the other hand, the n type source region 12 is formed to be self-aligned with the side wall 18. The n type source low concentration layer 19 alleviates an electric field near the n type source region 12, thereby limiting a hot electron effect. In addition, a silicide contact 20 is formed on a surface of the n type source region 12 in the semiconductor substrate 2.

The n type tunnel diffusion layer 13 is formed in a region opposing a portion of the floating gate 15 and acts as a drain region of the memory cell transistor 10. Specifically, the n type tunnel diffusion layer 13 includes a plurality of regions arranged at intervals in the longitudinal direction of the active areas 4. For example, the n type tunnel diffusion layer 13 includes a first region 131 facing one end of the floating gate 15 near the select transistor 11, and a second region 132 facing the other end of the floating gate 15 far from the select transistor 11. The first region 131 is formed to overlap with an n type tunnel low concentration layer 25 (which will be described layer) and the second region 132 is formed to overlap with the n type source region 12 and the n type source low concentration layer 19.

On the other hand, the select transistor 11 includes a source region corresponding to the n type tunnel diffusion layer 13 (specifically, the first region 131), an n type drain region 21 formed in the semiconductor substrate 2 to be spaced from the source region by a predetermined distance, and a select gate 23 disposed to face a channel region 22 between the n type tunnel diffusion layer 13 and the n type drain region 21. The select gate 23 has a monolayer structure of a conductive film having the same thickness (1500 Å or so) as the floating gate 15. For the purpose of clarity, the select gate 23 is indicated as the shaded region labeled with reference numeral 23, as shown in FIG. 1.

The select gate 23 is formed in the form of a line extending in the direction intersecting (in this embodiment, a direction perpendicular to) the longitudinal direction of the active areas 4 and extends across the plurality of active areas 4. That is, the select gate 23 serves as a common electrode of the plurality of nonvolatile memory cells 9. In addition, an insulating film 24 made of an insulating material such as silicon oxide or the like is formed on a side of the select gate 23. The insulating film 24 has the same thickness as the thinned portion of the gate insulating film 29 in the tunnel window 31 which will be described later. In addition, an insulating film 30 is formed on the top of the select gate 23, as will be described later.

The n type tunnel low concentration layer 25 widened from right below the side wall 18 and a side wall 26 (which will be described later) is formed between the memory cell transistor 10 and the select transistor 11 in the semiconductor substrate 2. The n type tunnel low concentration layer 25 is formed at a concentration lower than that of the n type tunnel diffusion layer 13 and doped with impurity ions more deeply than the n type tunnel diffusion layer 13. For example, the doping depth may be the same (0.2 μm to 0.3 μm) as the n type source low concentration layer 19. The n type tunnel low concentration layer 25 and the n type tunnel diffusion layer 13 (specifically, the first region 131) form a Lightly Doped Drain (LDD) structure. In this LDD structure, the n type tunnel low concentration layer 25 is formed to be self-aligned with both of the floating gate 15 and the select gate 23. On the other hand, the first region 131 of the n type tunnel diffusion layer 13 is formed to be self-aligned with the select gate 23.

In addition, like the floating gate 15 and the control gate 16, both sides of the select gate 23 of the select transistor 11 are also covered by the side wall 26 made of an insulating material such as silicon oxide or the like. The n type drain region 21 is formed in an n type drain low concentration layer 27 widened from just below the side wall 26, thus forming an LDD structure. The n type drain low concentration layer 27 is formed at a concentration lower than that of the n type drain region 21 and doped with impurity ions more deeply than the n type drain region 21. For example, the doping depth may be the same (0.2 μm to 0.3 μm) as the n type source low concentration layer 19. In addition, the n type drain low concentration layer 27 is formed to be self-aligned with the select gate 23. On the other hand, the n type drain region 21 is formed to be self-aligned with the side wall 26. The n type drain low concentration layer 27 alleviates an electric field near the n type drain region 21, thereby limiting a hot electron effect. That is, a withstanding voltage of the n type drain region 21 can be improved and the n type drain low concentration layer 27 is formed to be self-aligned with the select gate 23. Accordingly, no drain offset need to be employed, thereby preventing the memory cell transistor 10 from being increased in size. In addition, the n type drain low concentration layer 27 is as deep as 0.2 μm to 0.3 μm to achieve a sufficient withstanding voltage. In addition, a silicide contact 28 is formed on a surface of the n type drain region 21 in the semiconductor substrate 2.

A gate insulating film 29 made of, for example, silicon oxide is interposed between the semiconductor substrate 2 and the floating gate 15/the select gate 23. An insulating film 30 is interposed between the floating gate 15 and the control gate 16 for electrical isolation therebetween. For example, the insulating film 30 has an ONO (Oxide film-Nitride film-Oxide film) structure where a silicon nitride film is sandwiched between a pair of silicon oxide films.

The gate insulating film 29 includes a thinned portion which is formed between the n type tunnel diffusion layer 13 (specifically, the first region 131) and the floating gate 15, and is made thinner than a remaining peripheral portion of the gate insulating film 29. This film portion corresponds to the above-mentioned tunnel window 31 through which electrons are passed between the n type tunnel diffusion layer 13 and the floating gate 15 by FN (Fowler-Nordheim) tunneling.

The tunnel window 31 will be described in more detail below with reference to FIG. 3. The tunnel window 31 includes a first portion 311 which is covered by the floating gate and a second portion 312 which is not covered by the floating gate 15. The first portion 311 includes a first boundary edge 32 neighboring the peripheral portion of the gate insulating film 29 and a second boundary edge neighboring the second portion 312. The dimension $W_1$ of the first portion 311 (a distance between the side of the floating gate 15 and the first boundary edge 32) along the front surface of the semiconductor substrate 2 is 0.2 μm to 0.3 μm. In the tunnel window 31, the second portion 312 and the second boundary edge 33 of the first portion 311 are selectively made thick. Specifically, while a thickness ($T_1$) of the peripheral portion of the gate insulating film 29 is, e.g., about 300 Å, a thickness ($T_2$) of the most of the first portion 311 is, e.g., about 85 Å and thickness ($T_3$) of the selectively thickened second boundary edge 33 and the second portion 312 is, e.g., about 100 Å. A film thickness difference ($T_3-T_2$) selectively produced in the tunnel window 31 is provided by a step S formed in a bottom side of the second boundary edge 33 with the top of the second portion 312 flush with the top of the first portion 311. That is, the top of the tunnel window 31 (a surface facing the floating gate 15) has a planar shape with no step between the first portion 311 and the second portion 312.

Electrons are injected into the floating gate 15, for example in a state where the select transistor 11 is tuned on by application of a high voltage to the select gate 23 with a source being opened. In this state, when a high voltage is applied to the control gate 16 and a drain is set to a ground potential, the electrons are injected from the n type tunnel diffusion layer 13 into the floating gate 15 by FN tunneling through the tunnel window 31.

Electrons are drawn out of the floating gate 15, for example in a state where the select transistor 11 is tuned on by application of a high voltage to the select gate 23 with the source being opened. In this state, when the control gate 16 is set to a ground potential and a high voltage is applied to the drain, the electrons are drawn from the floating gate 15 into the n type tunnel diffusion layer 13 by FN tunneling through the tunnel window 31.

When the electrons are injected into the floating gate 15, a threshold voltage applied to the control gate 16 to allow current to flow through the memory cell transistor 10 is increased under a state where the floating gate 15 is electrified. Here, a read voltage to be applied to the control gate 16 is set to a value capable of enabling an electrical conduction between the n type source region 12 and the n type tunnel diffusion layer 13 under a state where the floating gate 15 is non-electrified (electrons are drawn out of the floating gate 15) and enabling electrical isolation between the n type source region 12 and the n type tunnel diffusion layer 13 under a state where the floating gate 15 is electrified (electrons are injected into the floating gate 15). Then, the read voltage is applied to the control gate 16 with the select gate 23 of the select transistor 11 set to a high level and the drain set to a high level. At this time, it can be determined whether or not electrons are injected into the floating gate 15 by checking whether or not current is flowing through the source.

Thus, operations such as write, erase and read of data for the nonvolatile memory cell 9 can be performed.

Referring to FIGS. 1 and 2 again, an interlayer insulating film 34 made of an insulating material, such as silicon oxide film or the like, is stacked on the semiconductor substrate 2. The select gate 23, the floating gate 15 and the control gate 16 are collectively covered by the interlayer insulating film 34.

A source electrode 35 and a drain electrode 36 made of a conductive material (such as aluminum or the like) and a surface protective film 37 made of an insulating material (such as silicon nitride or the like) to cover the source electrode 35 and the drain electrode 36 are formed on the interlayer insulating film 34. Contact plugs 38 and 39 to connect the source electrode 35 and the drain electrode 36 to the silicide contact 20 and the silicide contact 28, respectively, are buried in the interlayer insulating film 34.

FIGS. 4A to 4S are sectional views for illustrating an example process of manufacturing the semiconductor device 1. FIGS. 5A and 5B are sectional views for illustrating a process of forming the tunnel window 31. First, as shown in FIG. 4A, a pad oxide film 40 (e.g., about 120 Å in thickness) and a silicon nitride film 41 (e.g., about 2000 Å in thickness) are formed in this order on the front surface of the semiconductor substrate 2. Subsequently, the pad oxide film 40 and the silicon nitride film 41 are patterned in such a manner that an opening to expose a region corresponding to the groove of the isolation portion 5 in the semiconductor substrate 2 is formed in the pad oxide film 40 and the silicon nitride film 41. Using the pad oxide film 40 and the silicon nitride film 41 as a mask, an etching operation is performed to form the groove 6 in the semiconductor substrate 2.

Next, as shown in FIG. 4B, ion injection is performed to form a p type field stop region 8. Specifically, p type impurity ions are injected into the bottom of the groove 6 using the pad oxide film 40 and the silicon nitride film 41 as a mask. At this time, an acceleration voltage to be applied to the p type impurity ions is controlled to a value capable of preventing the p type impurity ions from being escaped from the silicon nitride film 41. Thus, the field stop region 8 is formed on the bottom of the groove 6.

Figure 4D:
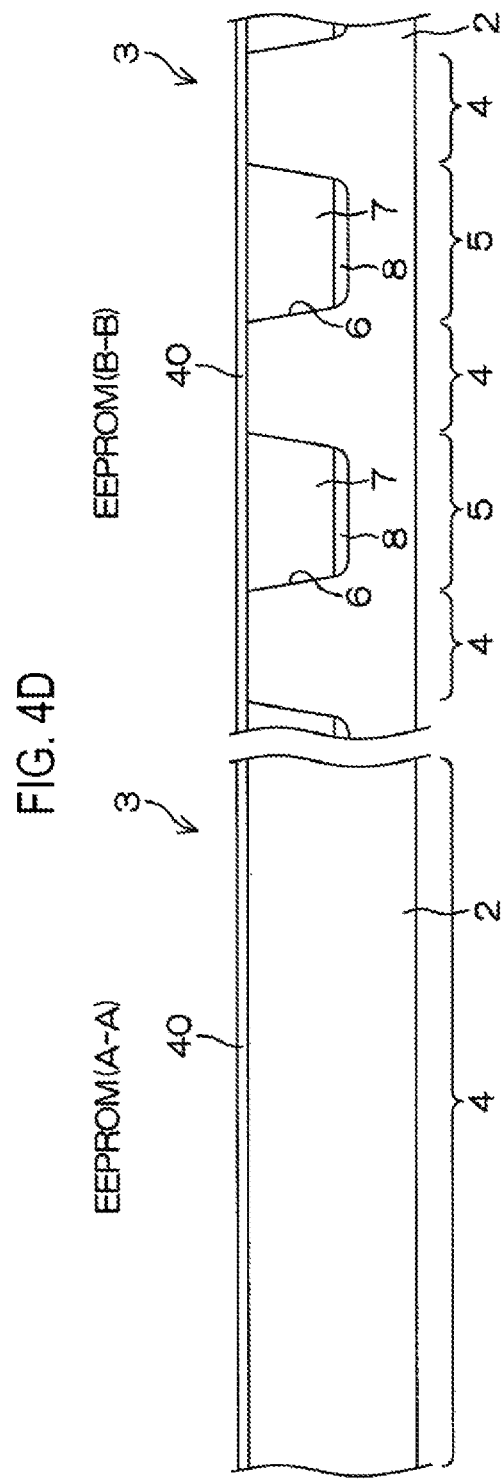
FIG. 4D is a view showing a process following the process of FIG. 4C.
Figure 5B:
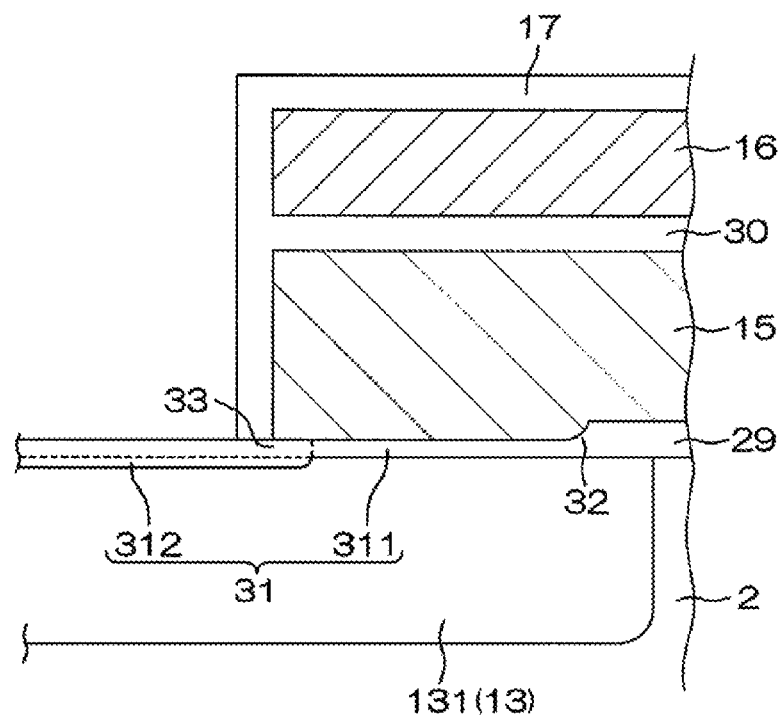

Next, as shown in FIG. 4C, the groove 6 is filled with an insulating film 42 made of an insulating material, such as silicon oxide or the like. Specifically, a process of depositing an insulating film 42 made of the insulating material and a process of thinning a portion of the insulating film 42 except a portion in the groove 6 are repeatedly performed until the groove 6 is completely filled with the insulating material. The insulating film 42 deposition is performed by, for example, plasma CVD (preferably, high density plasma (HDP) CVD) and the insulating film 42 thinning is performed by, for example, RIE (Reactive Ion Etching). Finally, the insulating film 42 having a thickness of, for example, about 7000 Å from the bottom of the groove 6 is formed. The repetition of the insulating film deposition and thinning can prevent a thick insulating film from being formed in a portion other than the groove 6 when the groove 6 having a depth of 0.50 μm or more is filled. Next, as shown in FIG. 4D, the insulating film 42 is polished by CMP until the insulating film 42 is flush with the silicon nitride film 41 to form an insulator 7 filled in the groove 6. Thereafter, the pad oxide film 40 is thickened to, for example, about 110 Å by thermally oxidizing the semiconductor substrate 2 after removing the silicon nitride film 41 by etching.

Subsequently, as shown in FIG. 4E, ion injection (tunnel junction) is performed to form the n type tunnel diffusion layer 13. Specifically, a resist film 43 having a predetermined pattern is formed on the semiconductor substrate 2 and n type impurity ions are injected into the semiconductor substrate 2 using the resist film 43 as a mask. At this time, an acceleration voltage to be applied to the n type impurity ions is, for example, about 90 keV. Thus, the n type tunnel diffusion layer 13 is formed. Thereafter, a surface concentration of the channel regions 14 and 22 may be adjusted by selectively injecting impurity ions into regions to serve as the channel regions 14 and 22.

Next, as shown in FIG. 4F, the gate insulating film 29 is formed by thermally oxidizing the semiconductor substrate 2 after removing the pad oxide film 40 by wet etching. The thermal oxidation at this time is preferably performed at a temperature of, for example, 950 degrees C. or higher. Accordingly, even if the insulator 7 having a STI structure is expanded when the gate insulating film 29 is formed, the degree of expansion can be restricted to alleviate a stress exerted on the peripheral semiconductor substrate 2 having a STI structure. Subsequently, the surface of the gate insulating film 29 is SPM-cleaned. For example, a hexamethyldisilazane (HMDS) chemical liquid is applied on the surface of the gate insulating film 29, thereby making the surface of the gate insulating film 29 hydrophilic. This can improve adhesion between the gate insulating film 29 and a resist film 44 (which will be described below) used when the tunnel window 31 is formed, thereby limiting a deviation of the dimension of the tunnel window 31.

Next, as shown in FIGS. 4G and 4H, the tunnel window 31 is formed. Specifically, the resist film 44 having an opening to expose a region in the gate insulating film 29 corresponding to the tunnel window 31 is formed on the gate insulating film 29. Subsequently, the gate insulating film 29 exposed from the resist film 44 is removed by etching (for example, wet etching using hydrofluoric acid as an etchant) using the resist film 44 as a mask. At this time, the etchant supplied into the opening permeates below the resist film 44 along an edge of the opening. Accordingly, an opening 45 formed by the wet etching is enlarged over a predetermined designed value (that is, the dimension of the opening of the resist film 44). Subsequently, the resist film 44 is removed and an oxide film is grown to a predetermined film thickness (e.g., 50 Å to 100 Å, and more specifically as an example, about 85 Å) to allow for FN tunneling of electrons by thermal oxidation. Thus, the tunnel window 31 constituted by the oxide film having the predetermined film thickness is formed and the gate insulating film 29 is thickened by the same film thickness.

Next, as shown in FIGS. 4I to 4K, a process of forming the floating gate 15, the control gate 16 and the select gate 23 is performed. First, as shown in FIG. 4I, the floating gate 15, the control gate 16 and the select gate 23 can be formed by forming a polysilicon film 46 as a first conductive film added with impurities (for example, phosphorus) for electrical conduction on the entire surface of the semiconductor substrate 2 and patterning it with photolithography. That is, a pattern of resist film (not shown) is formed on the polysilicon film 46 formed on the entire surface. This resist film pattern is a pattern to selectively expose a region between adjacent active areas 4 for the nonvolatile memory cell 9 and cover other regions. A space 47 can be formed between adjacent active areas 4 for the nonvolatile memory cell 9 in the polysilicon film 46 by performing an etching operation using this resist film as a mask.

Subsequently, as shown in FIG. 4J, an insulating film is formed on the entire surface of the semiconductor substrate 2 by, for example, chemical vapor deposition (CVD). Specifically, a silicon oxide film having a thickness of, e.g., about 60 Å is first formed, a silicon nitride film having a thickness of, e.g., about 60 Å is then formed, and a silicon oxide film having a thickness of, e.g., about 50 Å is subsequently formed. Thus, the insulating film 30 having an ONO (Oxide film/Nitride film/Oxide film) structure is formed. Subsequently, a polysilicon film 48 as a second conductive film added with impurities (for example, phosphorus) for electrical conduction is formed on the entire surface of the semiconductor substrate 2.

Next, as shown in FIG. 4K, the polysilicon film 48 for the control gate 16, the insulating film 30 having the ONO structure, and the polysilicon film 46 for the floating gate 15 and the select gate 23 are collectively patterned using the same mask pattern. The collective patterning is performed by photolithography. That is, a resist film 49 is formed on the polysilicon film 48 for the control gate 16. A pattern of this resist film 49 is a pattern to selectively cover a region where the control gate 16 is to be formed (the floating gate 15 is accommodated in this region) and a region where the select gate 23 is to be formed, and expose other regions. By performing an etching operation using this resist film 49 as a mask, a stacked structure including the floating gate 15, the insulating film having the ONO structure, and the control gate 16 can be collectively formed and, at the same time, a stacked structure including the select gate 23 and a sacrificial gate 50 constituted by the polysilicon film 48 can be collectively formed.

In this manner, by the collective etching using the same mask pattern, the floating gate 15 and the control gate 16 are formed to cover one portion (the first portion 311) of the tunnel window 31 having the size set in the process of FIG. 4G, the one portion having the predetermined width (0.2 μm to 0.3 μm) from the first boundary edge 32 neighboring the peripheral gate insulating film 29 (see FIG. 3). By covering the tunnel window 31 by a required predetermined width with respect to the first boundary edge 32 with the floating gate 15 and the control gate 16, the width of the first portion 311 can be freely adjusted. Accordingly, it is possible to miniaturize the first portion 311 responsible for substantial function of the tunnel window 31 irrespective of size of the pre-formed tunnel window 31 (for example, even if the dimension of the tunnel window 31 is more than 0.4 μm).

Next, as shown in FIGS. 4L and 5A, after the resist film 49 is removed by wet etching (for example, wet etching using sulfuric acid as an etchant) under a state where the second portion 312 of the tunnel window 31 is exposed, the second portion 312 of the tunnel window 31 is removed by wet etching (for example, wet etching using hydrofluoric acid as an etchant). The second portion 312 is removed to such a degree that it is over-etched. For example, if the thickness of the second portion 312 is 85 Å, the second portion 312 is etched to a degree corresponding to 100 Å. The etchant supplied for etching permeates below the floating gate 15 along a side of the floating gate 15. Thus, since the boundary edge 33 of the first portion 311 is removed along with the second portion 312, an edge of an opening 51 formed by the wet etching is recessed toward the first boundary edge 32 of the tunnel window 31 with respect to the side of the floating gate 15. Accordingly, the dimension of the first portion 311 is slightly changed during the wet etching process as compared to the dimension of the first portion 311 when the floating gate 15 and the control gate 16 were just formed. However, since such erosion of the tunnel window 31 proceeds only from an opposite end (the second boundary edge 33 side) of the first boundary edge 32 of the tunnel window 31 in such a manner that it decreases the dimension of the first portion 311, it has little effect on the miniaturization of the memory cell transistor 10.

Next, as shown in FIGS. 4M and 5B, an oxide film is grown by a predetermined thickness (e.g., 50 Å to 100 Å, and more specifically as an example, about 80 Å) by means of thermal oxidation. Accordingly, a tunnel window 31 which has a thicker portion than a remaining portion of the tunnel window 31 is reproduced on the semiconductor substrate 2. This can result in the tunnel window 31 being selectively thickened in its second portion 312 and the second boundary edge 33 of the first portion 311. Thickness of the resultant gate insulating film 29 in a region other than the tunnel window 31 is, for example, 200 Å to 300 Å. In addition, the stacked structure of the floating gate 15 and the control gate 16 made of polysilicon and the stacked structure of the select gate 23 and the sacrificial gate 50 are also thermally oxidized and the insulating films 17 and 24 having the same thickness as the tunnel window 31 are simultaneously formed on the (top and side) surfaces of these gates 15, 16, 23 and 50. In this manner, by once removing a portion of the tunnel window 31 and then reproducing the tunnel window 31, the surface of the tunnel window 31 damaged when removing the resist film 49 can be reproduced with good conditions.

Next, as shown in FIG. 4N, the n type source low concentration layer 19, the n type tunnel low concentration layer 25 and the n type drain low concentration layer 27 are formed. That is, n type impurity ions are selectively injected into the front surface of the semiconductor substrate 2 under a state where the semiconductor substrate 2 is not covered by a mask pattern. When the n type impurity ions are injected, the n type source low concentration layer 19, the n type tunnel low concentration layer 25 and the n type drain low concentration layer 27 are respectively formed to be self-aligned with the floating gate 15 and the select gate 23 in the active areas 4 for the nonvolatile memory cell 9. For example, $P^+$ ions are used as the n type impurity ions with a dose of $1 \times 10^{12}$ to $1 \times 10^{13}$/cm$^2$ and injection energy of 50 keV to 100 keV (preferably, 80 keV). At this time, since the sacrificial gate 50 is left on the select gate 23, it is possible to prevent the impurity ions from being escaped from the select gate 23 and being injected into the channel region right below the select gate 23 even if an acceleration voltage applied to the impurity ions is increased to expand the n type drain low concentration layer 27 and the like to a deeper region. This allows a withstanding voltage of the n type drain region 21 to be improved simply without changing a surface concentration of the channel region 22.

Next, as shown in FIG. 4O, the sacrificial gate 50 is removed. Specifically, a resist film 52 having a predetermined pattern is formed on the semiconductor substrate 2 and the sacrificial gate 50 is etched using the resist film 52 as a mask. The resist film 52 covers the floating gate 15, the control gate 16 and the tunnel window 31 in the active areas 4 for the nonvolatile memory cell 9 and has an opening 53 to expose the sacrificial gate 50. The opening 53 is formed to have a tapered shape increasing in diameter from the bottom toward the top. When the opening 53 has such a tapered shape, the sacrificial gate 50 to be removed can be simply exposed while covering the tunnel window 31. The sacrificial gate 50 is removed by, for example, RIE (Reactive Ion Etching).

Next, as shown in FIG. 4P, the side walls 18 and 26 are formed. That is, an insulating film such as a silicon nitride film or the like is formed on the entire surface of the semiconductor substrate 2 by, for example, CVD, and then is etched back by dry etching. When the etch back is performed until the select gate 23 and the control gate 16 are exposed, the side walls 18 and 26 are formed on both sides of the gates 23 and 16, respectively.

Figure 4Q:
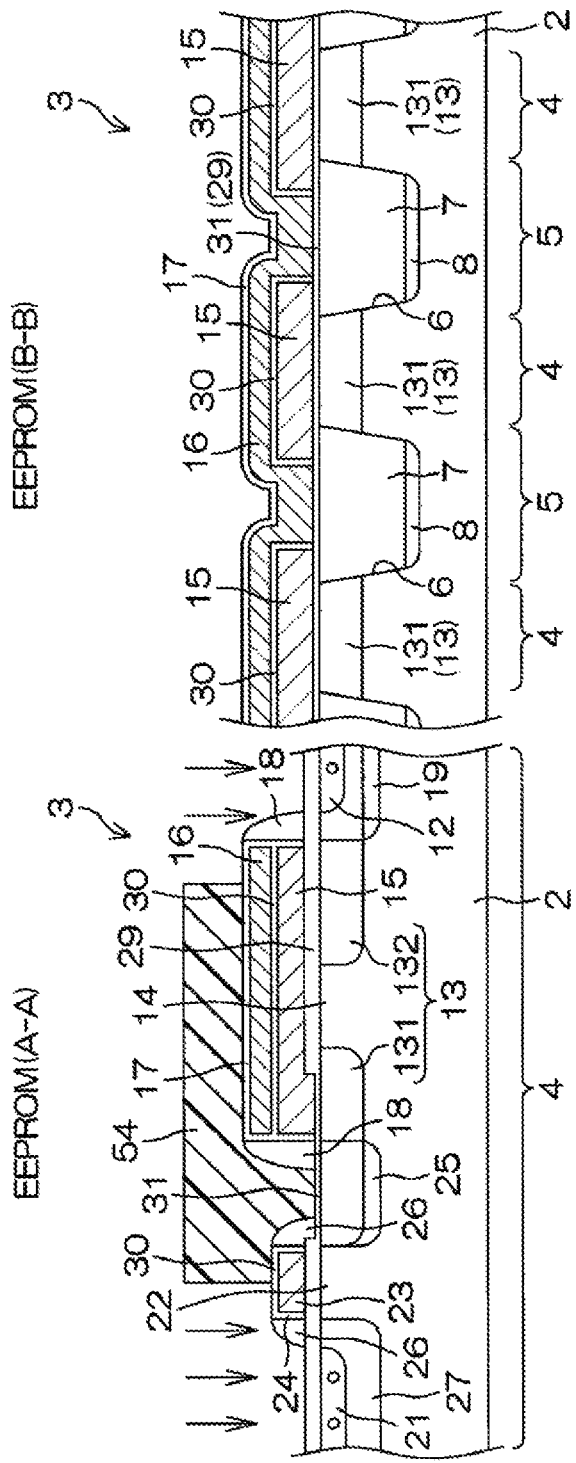
FIG. 4Q is a view showing a process following the process of FIG. 4P.

Next, as shown in FIG. 4Q, the n type source region 12 and the n type drain region 21 are formed. Specifically, using a resist film 54 as a mask, n type impurity ions are selectively injected into the front surface of the semiconductor substrate 2. The resist film 54 has a pattern to expose regions corresponding to the n type source region 12 and the n type drain region 21 in the active areas 4 for the nonvolatile memory cell 9. When the n type impurity ions are injected into the front surface of the semiconductor substrate 2 using the resist film 54 as a mask, the n type source region 12 and the n type drain region 21 are formed in the active areas 4 for the nonvolatile memory cell 9. For example, $As^+$ ions are used as the n type impurity ions with a dose of $1 \times 10^{15}$ to $5 \times 10^{15}$/cm$^2$ and injection energy of 50 keV to 100 keV. Thus, the n type source region 12 and the n type drain region are formed.

Next, as shown in FIG. 4R, the silicide contacts 20 and 28 are formed on the surfaces of the n type source region 12 and the n type drain region 21, respectively. Thereafter, as shown in FIG. 4S, the interlayer insulating film 34 to cover the entire surface is formed, a plurality of contact holes to expose the silicide contacts 20 and 28 are formed in the interlayer insulating film 34, and the contact plugs 38 and 39, the source electrode 35 and the drain electrode 36 to contact the silicide contacts 20 and 28 through these contact holes are formed. The interlayer insulating film 34 may have a multi-layered structure.

Then, the surface protective film 37 is formed on the interlayer insulating film 34 and an opening (not shown) to expose each electrode as a wire bonding pad is formed in the surface protective film 37. The semiconductor device 1 shown in FIG. 1 can be obtained through the above processes. As described above, according to the method of this embodiment, since the floating gate 15 and the control gate 16 are simultaneously formed by an etching operation using the same mask pattern (the resist film 49) as shown in FIG. 4K, sides of these two gates 15 and 16 can be made coplanar irrespective of alignment accuracy of the control gate 16 with respect to the floating gate 15.

On the other hand, if the polysilicon film 48 is formed in portions other than the portion where the floating gate 15 is formed in the memory cell region 3, the sacrificial gate 50 made of the polysilicon film 48 may be left on the select gate 23 formed of the polysilicon film 46. With this sacrificial gate 50 being electrically floated, a threshold voltage of the select gate 23 is likely to be unstable in an operation of the memory cell (e.g., during write, erase and read operations). The residual sacrificial gate 50 has to be fixed at a ground potential in order to avoid this problem. However, this requires a wasteful wiring space, which may be an obstacle to improvement of miniaturization of the nonvolatile memory cell 9.

However, in this embodiment, as shown in FIG. 4O, the sacrificial gate 50 left on the select gate 23 is removed by an etching operation after forming the floating gate 15 and the control gate 16. This eliminates a need of the wasteful wiring space. Although the particular embodiment of the present disclosure has been shown and described in the above, various embodiments of the present disclosure can be practiced with other various embodiments.

For example, certain embodiments of the present disclosure may employ a configuration where the conductive type of semiconductor portions of the semiconductor device 1 is reversed. For example, in the semiconductor device 1, p type may be changed to n type and vice versa. Numerical details such as those shown in the above embodiments are merely examples and may have different values depending on required different specifications.

While certain embodiments have been described, these embodiments have been presented by way of example only, and are not intended to limit the scope of the disclosures. Indeed, the novel methods and devices described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device having a nonvolatile memory cell selectively formed on a semiconductor substrate, comprising:
    a gate insulating film disposed on the semiconductor substrate;
    a floating gate selectively formed on the gate insulating film in a region for the nonvolatile memory cell;
    a control gate disposed on the floating gate and having a side coplanar with a side of the floating gate;
    a select gate selectively formed on the gate insulating film in the region for the nonvolatile memory cell and having a mono-layered structure of a conductive film flush with the floating gate;
    a tunnel diffusion layer facing a portion of the floating gate in the semiconductor substrate;
    a tunnel window disposed in a portion of the gate insulating film between the floating gate and the tunnel diffusion layer, the tunnel window configured to be thinner than a remaining peripheral portion of the gate insulating film;
    a drain low concentration layer disposed in the semiconductor substrate, the drain low concentration layer self-aligned with a first side of the select gate opposite to the tunnel diffusion layer;
    a drain region disposed in the drain low concentration layer, the drain region self-aligned with a side wall covering the first side of the select gate, the drain low concentration layer being widened to a region that is deeper than the drain region and having an impurity concentration that is lower than that of the drain region; and
    a tunnel low concentration layer disposed to overlap a portion of the tunnel diffusion layer in the semiconductor substrate, the tunnel low concentration layer being self-aligned with a second side of the select gate facing the floating gate and a side of the floating gate facing the select gate.

2. The semiconductor device of claim 1, wherein the depth of the drain low concentration layer is between 0.2 µm and 0.3 µm.

3. The semiconductor device of claim 1, wherein the tunnel window includes a first portion covered by the floating gate and a second portion not covered by the floating gate, and the first portion having a first boundary edge neighboring the peripheral portion of the gate insulating film and a second boundary edge neighboring the second portion.

4. The semiconductor device of claim 3, wherein, in the tunnel window, the second portion and the second boundary edge of the first portion neighboring the second portion are selectively thickened.

5. The semiconductor device of claim 4, wherein a film thickness difference selectively produced in the tunnel window is provided by a step disposed at a bottom side of the second boundary edge with the top of the second portion flush with the top of the first portion.

6. The semiconductor device of claim 3, wherein the dimension of the first portion of the tunnel window along a front surface of the semiconductor substrate is between 0.2 µm and 0.3 µm.

7. The semiconductor device of claim 1, wherein the region for the nonvolatile memory cell includes a plurality of active areas arranged at intervals, and an isolation portion that is provided in a portion other than the active areas and has a STI (Shallow Trench Isolation) structure where an insulator is buried in a groove dug from the front surface of the semiconductor substrate, and the depth of the groove of the STI structure is 0.5 µm or more.

* * * * *